US011217452B2

(12) United States Patent
Izumoto et al.

(10) Patent No.: US 11,217,452 B2
(45) Date of Patent: Jan. 4, 2022

(54) SUBSTRATE PROCESSING DEVICE AND SUBSTRATE PROCESSING METHOD FOR CARRYING OUT CHEMICAL TREATMENT FOR SUBSTRATE

(71) Applicant: SCREEN Holdings Co., Ltd., Kyoto (JP)

(72) Inventors: Kenji Izumoto, Kyoto (JP); Nobuyuki Shibayama, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 16/899,472

(22) Filed: Jun. 11, 2020

(65) Prior Publication Data

US 2020/0303201 A1   Sep. 24, 2020

Related U.S. Application Data

(63) Continuation of application No. 15/974,248, filed on May 8, 2018, which is a continuation of application
(Continued)

(30) Foreign Application Priority Data

Aug. 17, 2012 (JP) .................................. 2012-180816
Aug. 20, 2012 (JP) .................................. 2012-181541

(51) Int. Cl.
*H01L 21/306* (2006.01)
*H01L 21/67* (2006.01)
(Continued)

(52) U.S. Cl.
CPC .... *H01L 21/30604* (2013.01); *H01L 21/0209* (2013.01); *H01L 21/02087* (2013.01);
(Continued)

(58) Field of Classification Search
None
See application file for complete search history.

(56) References Cited

U.S. PATENT DOCUMENTS 4,983,254 A   1/1991  Fujimura
5,288,333 A   2/1994  Tanaka et al.
(Continued)

FOREIGN PATENT DOCUMENTS

JP   2001-085383   3/2001
JP   2002-141326   5/2002
(Continued)

OTHER PUBLICATIONS

Aug. 2, 2016 Office Action issued for Taiwanese counterpart of the above-identified application, with English translation based on Japanese translation of same.
(Continued)

*Primary Examiner* — Allan W. Olsen
(74) *Attorney, Agent, or Firm* — Ostrolenk Faber LLP

(57) ABSTRACT

It is an object to carry out a chemical treatment for a peripheral edge part of a substrate while suppressing an amount of consumption of a processing liquid and a time required for processing. In order to achieve the object, a substrate processing device injects heating steam to a peripheral edge part of a substrate to heat the peripheral edge part when carrying out a chemical treatment for the peripheral edge part of the substrate while rotating the substrate in a substantially horizontal posture. Moreover, the substrate processing device injects a gas from above the substrate toward a predetermined injection target region defined within a range surrounded by a rotating track of the peripheral edge part of the substrate in an upper surface of the substrate, thereby generating, on the substrate, a gas flow
(Continued)

which flows from the injection target region toward the peripheral edge part of the substrate.

9 Claims, 13 Drawing Sheets

Related U.S. Application Data

No. 13/953,954, filed on Jul. 30, 2013, now Pat. No. 10,002,770.

(51) Int. Cl.
*H01L 21/02* (2006.01)
*H01L 21/3213* (2006.01)

(52) U.S. Cl.
CPC .... *H01L 21/6708* (2013.01); *H01L 21/67028* (2013.01); *H01L 21/67086* (2013.01); *H01L 21/32134* (2013.01)

(56) References Cited

U.S. PATENT DOCUMENTS

| | | | |
|---|---|---|---|
| 5,443,648 | A | 8/1995 | Ohkase |
| 5,601,655 | A | 2/1997 | Bok |
| 6,152,153 | A | 11/2000 | Takase |
| 6,174,817 | B1 | 1/2001 | Doshi |
| 6,409,838 | B1 | 6/2002 | Sakai |
| 6,805,769 | B2 | 10/2004 | Okuda et al. |
| 6,942,737 | B2 | 9/2005 | Sato .................. 134/6 |
| 7,182,821 | B2 | 2/2007 | Izumi et al. ............ 134/36 |
| 8,118,945 | B2 | 2/2012 | Eitoku |
| 8,235,062 | B2 | 8/2012 | Lauerhaas |
| 8,257,498 | B2 | 9/2012 | Yamawaku |
| 8,361,240 | B2 | 1/2013 | Hashimoto ............ 134/26 |
| 8,366,872 | B2 | 2/2013 | Tsutsumi et al. |
| 8,387,635 | B2 | 3/2013 | Collins |
| 8,684,014 | B2 | 4/2014 | Amano et al. |
| 8,828,183 | B2 | 9/2014 | Namba et al. |
| 8,887,741 | B2 | 11/2014 | Higashijima et al. |
| 9,257,292 | B2 | 2/2016 | Brown |
| 9,378,940 | B2 | 6/2016 | Kawano |
| 9,666,456 | B2 | 5/2017 | Collins |
| 2002/0051644 | A1 | 5/2002 | Sugimoto |
| 2004/0234696 | A1 | 11/2004 | Hongo |
| 2005/0115671 | A1 | 6/2005 | Araki |
| 2005/0236018 | A1 | 10/2005 | Nagami |
| 2007/0113874 | A1 | 5/2007 | Izumi et al. ............ 134/33 |
| 2008/0035610 | A1 | 2/2008 | Miya et al. ............ 216/84 |
| 2008/0142054 | A1 | 6/2008 | Eitoku |
| 2008/0176002 | A1 | 7/2008 | Tsutsumi et al. |
| 2008/0283090 | A1 | 11/2008 | DeKraker |
| 2009/0028672 | A1 | 1/2009 | Yamawaku |
| 2010/0095981 | A1 | 4/2010 | Kamikawa ............. 134/3 |
| 2010/0304554 | A1 | 12/2010 | Hidaka et al. |
| 2011/0030737 | A1 | 2/2011 | Amano et al. |
| 2011/0240597 | A1 | 10/2011 | Tsutsumi et al. |
| 2011/0240601 | A1 | 10/2011 | Hashizume et al. |
| 2012/0064256 | A1 | 3/2012 | Higashijima et al. |
| 2012/0223054 | A1 | 9/2012 | Azuma et al. |
| 2012/0247505 | A1 | 10/2012 | Brown |
| 2014/0231013 | A1 | 8/2014 | Hinode |
| 2014/0356539 | A1 | 12/2014 | Inatomi |
| 2014/0374022 | A1 | 12/2014 | Namba et al. |
| 2016/0013068 | A1 | 1/2016 | Butterbaugh |
| 2019/0011734 | A1 | 1/2019 | Otsuji |
| 2019/0043708 | A1 | 2/2019 | Sotoku |

FOREIGN PATENT DOCUMENTS

| | | |
|---|---|---|
| JP | 2003-001199 | 1/2003 |
| JP | 2004-006672 | 1/2004 |
| JP | 2005-191511 | 7/2005 |
| JP | 2005-243940 | 9/2005 |
| JP | 2007-5711 | 1/2007 |
| JP | 2008-047629 | 2/2008 |
| JP | 2008-80288 | 4/2008 |
| JP | 2008-091498 | 4/2008 |
| JP | 2008-98440 | 4/2008 |
| JP | 2008-130893 | 6/2008 |
| JP | 2008-177471 | 7/2008 |
| JP | 2009-170554 | 7/2009 |
| JP | 2010-103189 | 5/2010 |
| JP | 2010-103190 | 5/2010 |
| JP | 2010-147262 | 7/2010 |
| JP | 2010-165825 | 7/2010 |
| JP | 2011-054932 | 3/2011 |
| JP | 2011-066322 | 3/2011 |
| JP | 4950786 | 3/2012 |
| JP | 4960075 | 3/2012 |
| JP | 2012-084856 | 4/2012 |
| JP | 5014811 | 6/2012 |
| JP | 2013-153135 | 8/2013 |
| KR | 10-2011-0015372 | 2/2011 |

OTHER PUBLICATIONS

Japanese Office Action dated Apr. 26, 2016 with English translations of portions relevant to prior-art based rejections.
Office Action issued by Japanese Patent Office dated Nov. 17, 2015 in connection with corresponding Japanese Application No. 2012-181541 and English Translation thereof.
Office Action issued by Taiwanese Patent Office dated Oct. 16, 2015 in connection with corresponding Taiwanese application No. 102121801 and Japanese & English translations.
Decision to Grant issued by Korean Patent Office dated Nov. 17, 2015 in connection with corresponding Korean application No. 10-2013-0087363.
Office Action issued by Korean Patent Office dated Jan. 16, 2015 in connection with corresponding Korean Application No. 10-2013-0087363 & partial Japanese & English Translations thereof.

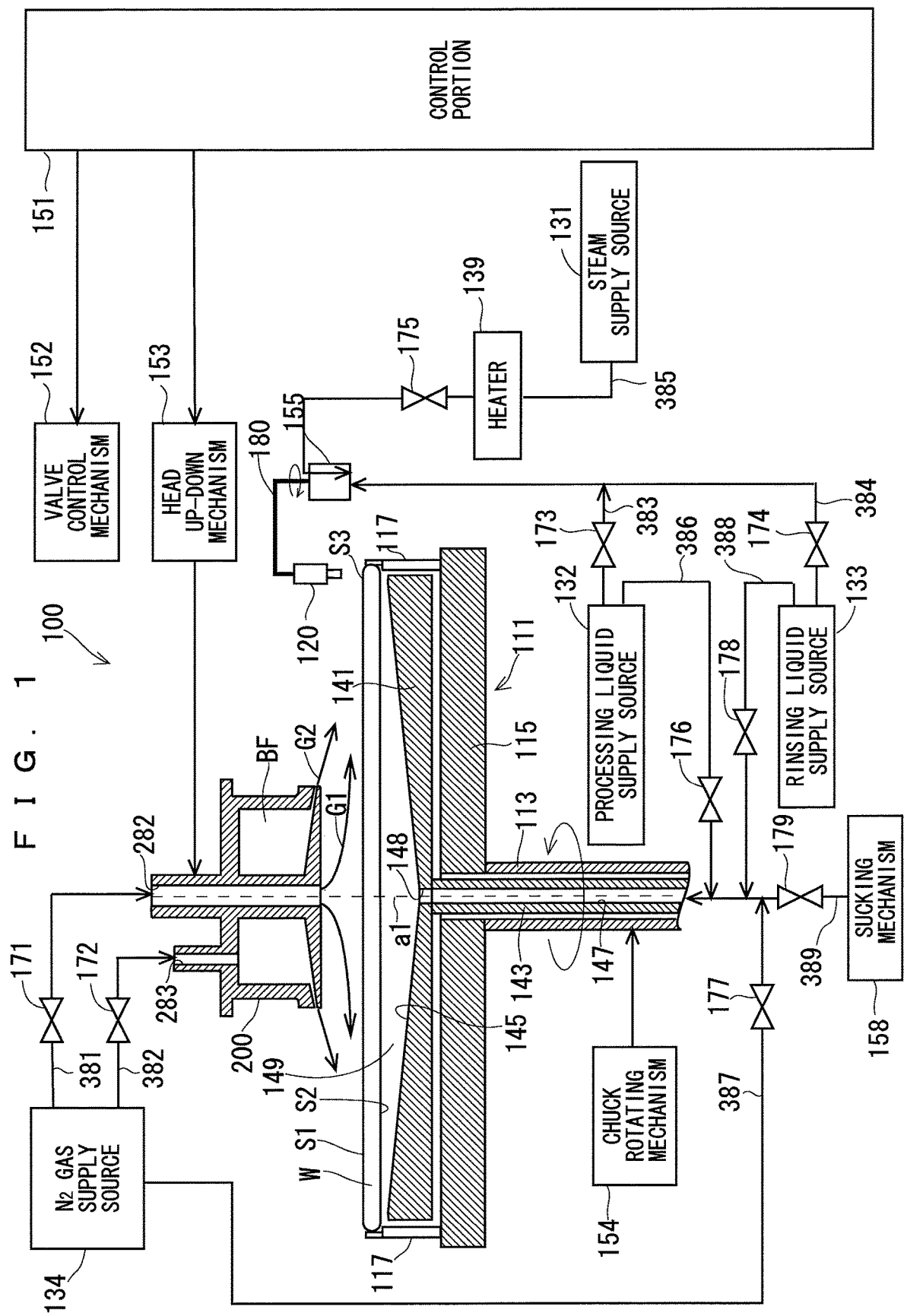
F I G . 1

F I G . 4
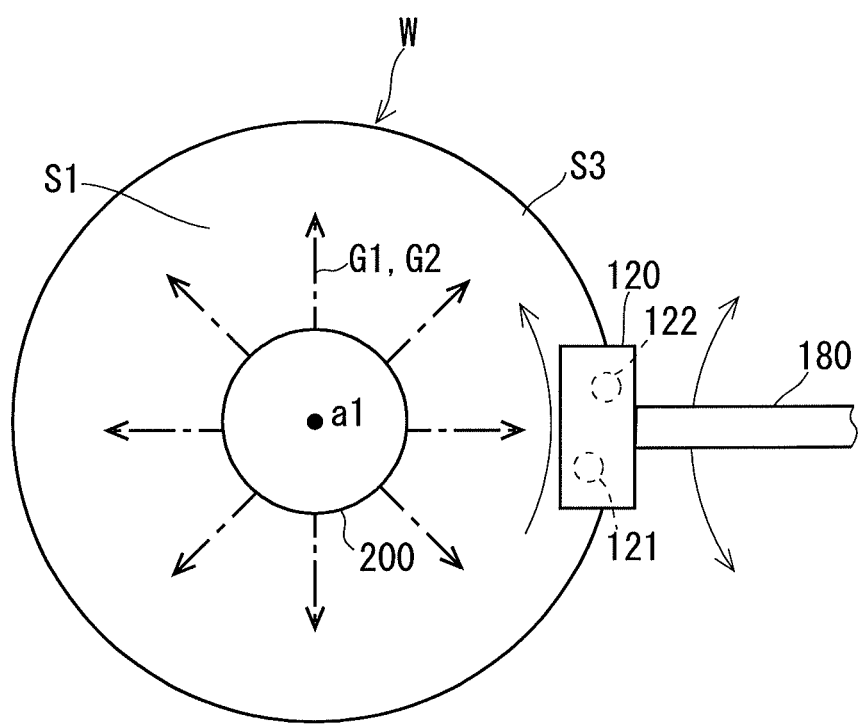

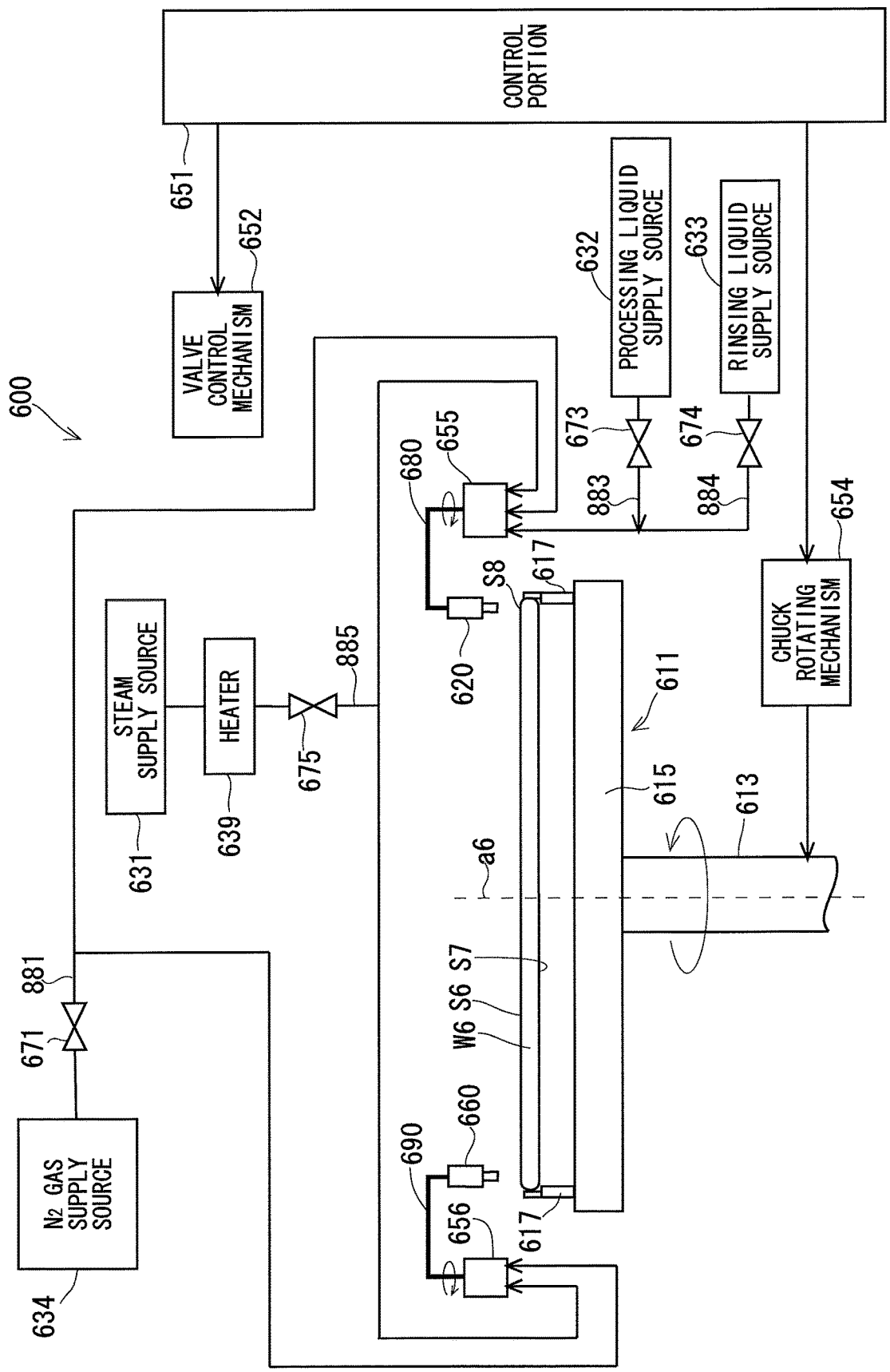

F I G . 1 2
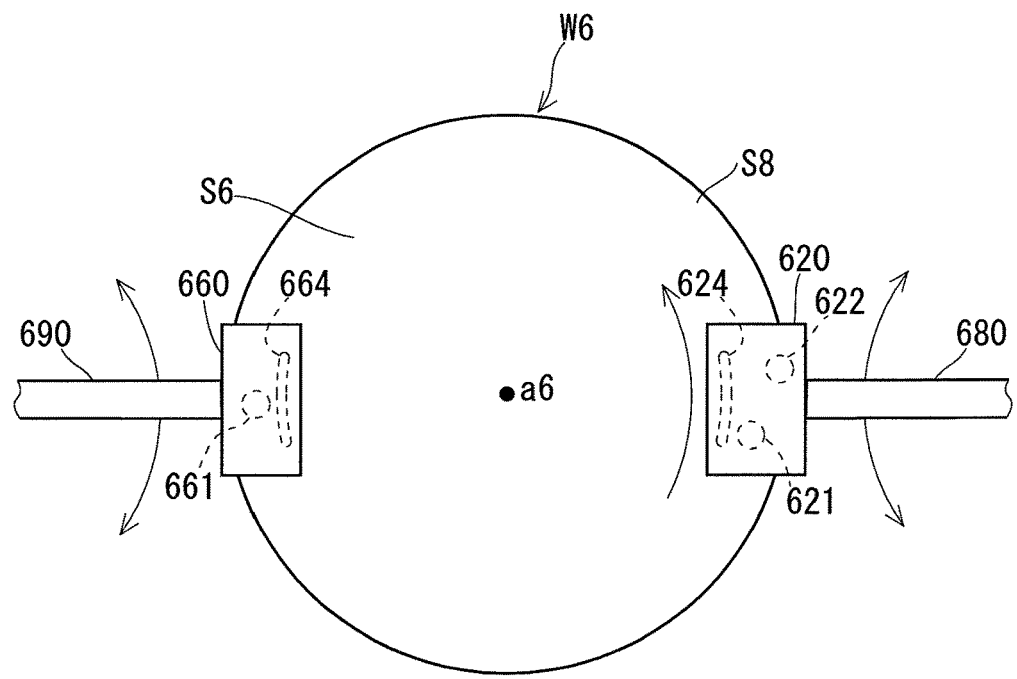
F I G . 1 3
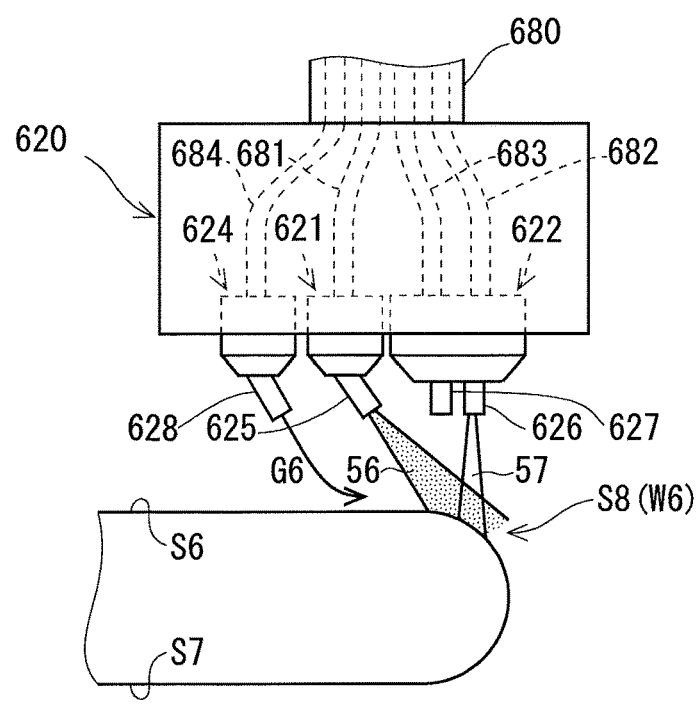

SUBSTRATE PROCESSING DEVICE AND SUBSTRATE PROCESSING METHOD FOR CARRYING OUT CHEMICAL TREATMENT FOR SUBSTRATE

CROSS-REFERENCE TO RELATED APPLICATIONS

The present patent application is a continuation of prior U.S. patent application Ser. No. 15/974,248, filed May 8, 2018, by Kenji IZUMOTO and Nobuyuki SHIBAYAMA entitled "SUBSTRATE PROCESSING DEVICE AND SUBSTRATE PROCESSING METHOD FOR CARRYING OUT CHEMICAL TREATMENT FOR SUBSTRATE," which is a continuation of U.S. patent application Ser. No. 13/953,954, filed Jul. 30, 2013, now U.S. Pat. No. 10,002,770, issued Jun. 19, 2018, which claims priority of Japanese Patent Application Nos. 2012-180816, filed Aug. 17, 2012 and 2012-181541, filed Aug. 20, 2012. The contents of each of the patent applications listed above are incorporated in full herein by reference.

BACKGROUND OF THE INVENTION

Field of the Invention

The present invention relates to a substrate processing device and a substrate processing method for supplying a processing liquid to a substrate to carry out a chemical treatment such as etching while rotating the substrate. The substrate to be processed includes substrates, for example, a semiconductor wafer, a substrate for an optical disk, a substrate for a magnetic disk, a substrate for a magneto-optical disk, a substrate for a photomask, a substrate for a solar cell, and the like.

Description of the Background Art

Although a series of processing steps for a substrate such as a semiconductor wafer have a plurality of film forming steps for forming a thin film of a metal, a photoresist or the like on a front surface ("an upper surface") of the substrate, a film is also formed on a back surface ("a lower surface") of the substrate or a peripheral edge part of the upper surface of the substrate at the film forming step in some cases. In general, however, the film formation is required for only a circuit formation region in a central part of the upper surface of the substrate in the substrate. In cases where the film is formed on the back surface of the substrate or the peripheral edge part of the upper surface of the substrate, a thin film formed on the peripheral edge part of the upper surface of the substrate may be peeled by contact with another device at a subsequent step to the film forming step, and may cause reduction in yield or a trouble of a substrate processing device itself.

Therefore, there is proposed a substrate processing device for carrying out so-called bevel etching, that is, previously supplying a processing liquid having its temperature controlled to a peripheral edge part of a substrate held in a substantially horizontal condition while rotating the substrate, thereby removing a thin film formed on the peripheral edge part of a upper surface of the substrate.

For example, the substrate processing device described in Japanese Patent Application Laid-Open No. 2004-6672 serves to supply the etchant from the nozzle taking an opposed shape to the central part in the lower surface of the substrate held in a substantially horizontal condition to the lower surface of the substrate while rotating the substrate, and to cause the etchant spreading toward the peripheral edge part by the action of centrifugal force to go around the peripheral edge part of the upper surface of the substrate, thereby etching the peripheral edge part of the upper surface of the substrate.

Moreover, the substrate processing device described in Japanese Patent Application Laid-Open No. 2008-47629 has the blocking member which is opposed to the upper surface of the substrate above the substrate and serves to supply the processing liquid from the nozzle disposed on the peripheral edge part of the blocking member toward the peripheral edge part of the upper surface of the substrate while rotating the substrate in the substantially horizontal plane, thereby etching the peripheral edge part of the upper surface of the substrate.

However, the devices disclosed in Japanese Patent Application Laid-Open Nos. 2004-6672 and 2008-47629 have a problem in that the amount of the processing liquid and the processing time which are required for the etching in the peripheral edge part are increased because the temperature of the peripheral edge part is reduced due to the rotation of the substrate, resulting in decrease in the etching rate.

In the technique of this type, it is demanded to reduce an etching width in the peripheral edge part ("end") of the upper surface of the substrate as small and evenly as possible in order to effectively utilize, as a device, an area over the substrate which is as large as possible. In the technical field of manufacture of a semiconductor device, particularly, it is desired to decrease an etching width of 2 to 3 mm in the related art down to 1 mm or less in order to reduce a loss in a peripheral edge part of a wafer which is increased with increase in diameter of a semiconductor wafer, for example.

As a method for reducing the etching width by the substrate processing device described in the Japanese Patent Application Laid-Open No. 2004-6672, it is supposed to decrease an amount of supply of the processing liquid and to increase the rotating speed of the substrate in order to reduce an amount of wraparound of the processing liquid toward the upper surface of the substrate. According to the method, although an average etching width can be reduced, uniformity of the etching width is deteriorated, for example, the amount of wraparound of the processing liquid to the peripheral edge part is controlled with difficulty so that a portion to be etched locally and greatly appears. Furthermore, there is also a problem in that the temperatures of the peripheral edge part and the processing liquid in the peripheral edge part are lowered, resulting in reduction in an etching rate.

In order to decrease the etching width by the substrate processing device described in the Japanese Patent Application Laid-Open No. 2008-47629, it is necessary to decrease the amount of supply of the processing liquid to be supplied to the peripheral edge part of the substrate. However, there is a problem in that the etching rate in the peripheral edge part of the substrate is reduced due to decrease in the amount of the processing liquid and reduction in the temperature of the processing liquid in a pipe due to the decrease.

These are problems which are not limited to the etching using an etchant, but are caused in general processing for carrying out a chemical treatment for a substrate by using a processing liquid having a chemical activity (chemical reactivity) varied depending on a temperature (a processing liquid having a reaction rate increased with a rise in temperature).

SUMMARY OF THE INVENTION

The present invention is directed to a substrate processing device for carrying out a chemical treatment for a substrate by using a processing liquid having a chemical activity varied depending on a temperature (a processing liquid having a reaction rate increased with a rise in temperature).

According to an aspect of the present invention, the substrate processing device includes a substrate holding portion for holding a substrate in a substantially horizontal posture; a rotating portion for rotating the substrate held in the substrate holding portion in a substantially horizontal plane; a heating portion for injecting heating steam to a peripheral edge part of the substrate to heat the peripheral edge part; a peripheral edge processing portion for supplying a processing liquid from above to the peripheral edge part heated by the heating portion, thereby carrying out a chemical treatment for the peripheral edge part; and a gas injecting portion for injecting a gas from above the substrate toward a predetermined injection target region defined within a range surrounded by a rotating track of the peripheral edge part of the substrate in an upper surface of the substrate, to generate, on the substrate, a gas flow which flows from the injection target region toward the peripheral edge part of the substrate.

The processing liquid is supplied to the peripheral edge part of the substrate heated by injecting the heating steam so that the chemical treatment for the peripheral edge part is carried out. Accordingly, it is possible to suppress reduction in a temperature of the peripheral edge part of the substrate by the rotation. Consequently, a change in the chemical activity of the processing liquid is also reduced and an amount of consumption of the processing liquid and a time required for processing are suppressed. The gas is injected from above the substrate toward the predetermined injection target region defined within the range surrounded by the rotating track of the peripheral edge part of the substrate in the upper surface of the substrate, to generate, on the substrate, a gas flow which flows from the injection target region toward the peripheral edge part of the substrate. Consequently, it is possible to prevent mist obtained by condensation of the steam or a mist-like processing liquid from adhering onto a non-processed region of the upper surface of the substrate. Therefore, it is possible to supply a sufficient amount of steam for heating the peripheral edge part of the substrate while suppressing deterioration in the non-processed region due to the adhering of the mist.

Preferably, the substrate processing device further includes a lower surface processing portion for supplying a processing liquid to a lower surface of the substrate, thereby carrying out a chemical treatment for the lower surface, the lower surface processing portion including an opposed surface which is opposed to a substantially entire region of the lower surface of the substrate which is rotated by the rotating portion and a processing liquid discharging port formed on the opposed surface, and discharging the processing liquid from the processing liquid discharging portion to bring a space between the lower surface of the substrate and the opposed surface to a fluid-tight condition with the processing liquid.

The processing liquid is discharged from the processing liquid discharging port of the lower surface processing portion including the opposed surface which is opposed to the substantially entire region of the lower surface of the substrate to be rotated so that the space between the lower surface of the substrate and the opposed surface is brought to the fluid-tight condition with the processing liquid. Therefore, even if the substrate is rotated at a low speed, the processing liquid can be supplied to the entire region of the lower surface of the substrate. Consequently, it is possible to carry out the chemical treatment for the peripheral edge part and the lower surface in the substrate while suppressing a drop in the temperature of the peripheral edge part of the substrate, thereby reducing energy required for heating the peripheral edge part. Moreover, it is possible to suppress wraparound of the processing liquid from the lower surface of the substrate to the peripheral edge part of the upper surface of the substrate by reducing the rotating speed of the substrate. Thus, it is easy to control the processing width of the peripheral edge part.

According to another aspect of the present invention, the substrate processing device includes a substrate holding portion for holding a substrate in a substantially horizontal posture; a rotating portion for rotating the substrate held in the substrate holding portion in a substantially horizontal plane; a plurality of heating portions disposed to be opposed to a plurality of different positions in a rotating track of a peripheral edge part of the substrate respectively and heating the peripheral edge part in the positions respectively; and a peripheral edge processing portion for supplying the processing liquid from above to the peripheral edge part heated by the plurality of heating portions, thereby carrying out a chemical treatment for the peripheral edge part.

The peripheral edge part is heated in the plurality of different positions in the rotating track of the peripheral edge part of the substrate respectively and the processing liquid is supplied to the peripheral edge part from above. Therefore, even in the case where the heating width in the radial direction in the peripheral edge part is small, the temperature of the peripheral edge part can be prevented from being reduced. Even if the amount of the processing liquid is small, it is possible to enhance reactivity of the processing liquid by suppressing reduction in a reaction rate of the processing liquid in the region having a small width which is heated by the heating portion in the peripheral edge part of the upper surface of the substrate. Accordingly, it is possible to reduce the chemical treating width while suppressing deterioration in each of uniformity of the chemical processing width and processing efficiency.

The present invention is also directed to a substrate processing method for carrying out a chemical treatment for a substrate by using a processing liquid having a chemical activity varied depending on a temperature (a processing liquid having a reaction rate increased with a rise in temperature).

According to an aspect of the present invention, a substrate processing method includes a rotating step of holding a substrate in a substantially horizontal posture to rotate the substrate in a substantially horizontal plane; a heating step of injecting heating steam to a peripheral edge part of the substrate to heat the peripheral edge part in parallel with the rotating step; a peripheral edge processing step of supplying a processing liquid from above to the peripheral edge part which is heated in the heating step, thereby carrying out a chemical treatment for the peripheral edge part; and a gas injecting step of injecting a gas from above the substrate toward a predetermined injection target region defined within a range surrounded by a rotating track of the peripheral edge part of the substrate in an upper surface of the substrate, to generate, on the substrate, a gas flow which flows from the injection target region toward the peripheral edge part of the substrate in parallel with the heating step and the peripheral edge processing step.

According to another aspect of the present invention, the substrate processing method includes a rotating step of holding a substrate in a substantially horizontal posture to rotate the substrate in a substantially horizontal plane; a heating step of heating a peripheral edge part of the substrate in a plurality of different positions in a rotating track of the peripheral edge part respectively in parallel with the rotating step; and a peripheral edge processing step of supplying a processing liquid from above to the peripheral edge part which is heated in the heating step, thereby carrying out a chemical treatment for the peripheral edge part.

Therefore, it is an object of the present invention to provide a technique capable of suppressing an amount of consumption of a processing liquid and a time required for processing. Moreover, it is another object of the present invention to provide a technique capable of reducing a chemical treating width (an etching width or the like) while suppressing deterioration in each of uniformity of the chemical treating width and chemical treating efficiency (an etching rate or the like).

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a view schematically showing an example of a schematic structure of a substrate processing device according to a first preferred embodiment;

FIG. 4 is a top view schematically showing an arrangement of a nozzle unit with respect to an upper surface of a substrate;

FIG. 11 is a view schematically showing an example of a schematic structure of a substrate processing device according to a second preferred embodiment;

FIG. 12 is a top view schematically showing an arrangement of a nozzle unit with respect to an upper surface of a substrate;

FIGS. 13 to 15 are side views each illustrating an example of a structure of the nozzle unit;

DESCRIPTION OF THE PREFERRED EMBODIMENTS

Figure 2:
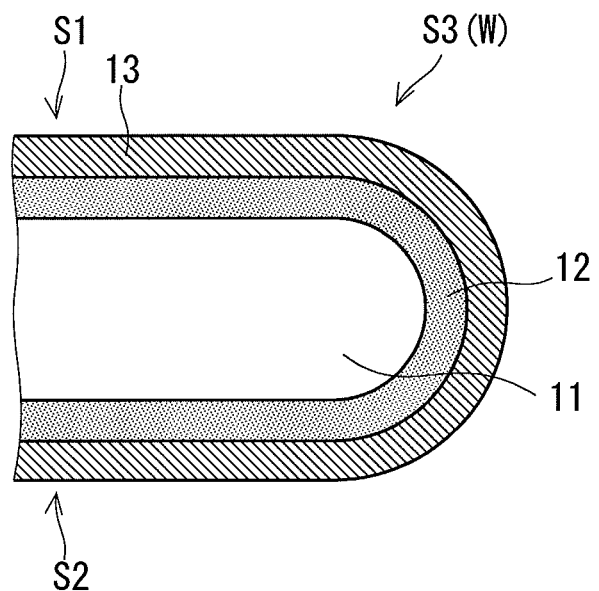
FIG. 2 is a view showing an example of a sectional view of a substrate.

A preferred embodiment according to the present invention will be described below with reference to the drawings. Portions having the same structures and functions have the same reference numerals in the drawings, and repetitive description will be omitted in the following explanation. Moreover, each of the drawings is shown schematically, and for example, a size, a positional relationship and the like of an illustrated member in the drawing are not always shown accurately.

Referring to First Preferred Embodiment

1. Structure of Substrate Processing Device

FIG. 1 is a view schematically showing an example of a schematic structure of a substrate processing device 100 according to a first preferred embodiment. The substrate processing device 100 carries out a chemical treatment for a substrate by using a processing liquid having a chemical activity varied depending on a temperature. More specifically, the substrate processing device 100 performs etching over a peripheral edge part (also referred to as "an upper surface peripheral edge part") S3 of a substrate W such as a semiconductor wafer in a front surface (also referred to as "an upper surface") S1 of the substrate W by using an etchant as a processing liquid for the chemical treatment, thereby removing a thin film (an unnecessary object) formed on the upper surface peripheral edge part S3. The upper surface peripheral edge part S3 is a ring-shaped region having a width of 1.0 to 3.0 mm from a peripheral edge of the substrate W in the upper surface S1 of the substrate W, for example. Moreover, the substrate processing device 100 also removes a thin film formed on a back surface (also referred to as "a lower surface) S2 of the substrate W by the etching. A upper surface shape of the substrate W is substantially circular, and the upper surface S1 of the substrate W implies a device formation surface on which a device pattern is to be formed.

Figure 3:
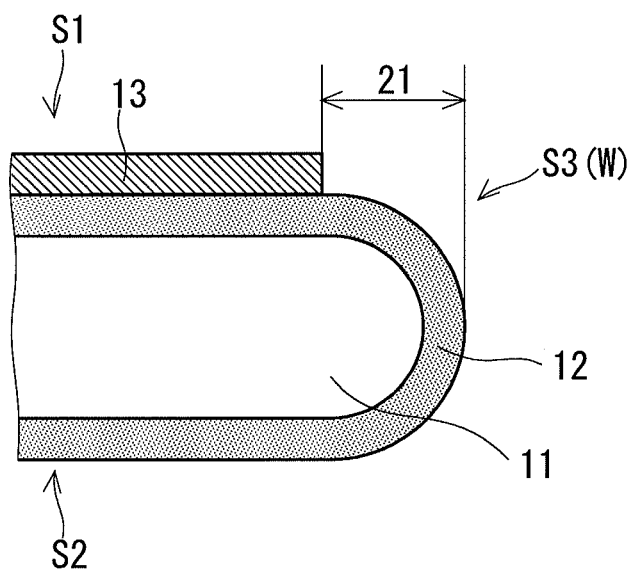
FIG. 3 is a view showing an example of the sectional view obtained after etching for the substrate in FIG. 2.

FIG. 2 is a view showing an example of a sectional view of the substrate W. FIG. 3 is a view showing an example of a sectional view obtained after the upper surface peripheral edge part S3 of the substrate W illustrated in FIG. 2 is subjected to etching. As shown in FIG. 2, a central layer 11 of the substrate W is constituted by silicon or the like. An insulating ground layer 12 is formed on the central layer 11 by a thin film such as a silicon nitride film or a silicon oxide film. An insoluble upper layer 13 is formed on the ground layer 12 by a thin film such as a TiN (titanium nitride) layer, an Al (aluminum) layer, or a W (tungsten) layer. As shown in FIG. 3, in the substrate W, the upper layer 13 in a region having a width 21 at a peripheral edge side of the upper surface peripheral edge part S3 is removed by the etching, for example. In the example of FIG. 3, the etching is also carried out over the back surface S2 of the substrate W so that the upper layer 13 in the entire region of the back surface S2 is also removed. Moreover, a substrate having only the ground layer 12 formed on the central layer 11 may be employed as the substrate W, for example, and the ground layer 12 in the upper surface peripheral edge part S3 of the substrate W may be removed.

In addition to the etchant to be used in the etching, most of chemical treating solutions have a chemical activity decreased with reduction in temperature. In other words, most of chemical treating solutions conform to the general Arrhenius equation in which a reaction rate is increased with a rise in temperature. In other words, most of processing liquids belong to "a processing liquid having a chemical activity varied depending on a temperature (a processing liquid having a reaction rate increased with a rise in temperature)".

As shown in FIG. 1, the substrate processing device 100 includes a spin chuck ("a substrate holding portion") 111 for holding and rotating the substrate W in a substantially horizontal posture with the upper surface S1 facing upward. The spin chuck 111 has a cylindrical rotating support shaft 113 coupled to a rotating axis of a chuck rotating mechanism ("a rotating portion") 154 including a motor, and is rotatable around a rotating axis al (a vertical axis), that is, in a substantially horizontal plane by a driving operation of the chuck rotating mechanism 154.

A disk-shaped spin base 115 is integrally coupled to an upper end of the rotating support shaft 113 by means of a fastening component such as a screw. Accordingly, the chuck rotating mechanism 154 is operated in response to an operation command sent from a control portion 151 for controlling the entire device so that the spin base 115 is rotated around the rotating axis al. Moreover, the control portion 151 controls the chuck rotating mechanism 154 to regulate a rotating speed. The control portion 151 is implemented through execution of a program stored in a memory by a CPU or the like, for example.

A plurality of chuck pins 117 for gripping the peripheral edge part of the substrate W is erected in the vicinity of the peripheral edge part of the spin base 115. It is sufficient that at least three chuck pins 117 are provided in order to reliably hold the circular substrate W, and the chuck pins 117 are disposed at an equal angle interval along the peripheral edge part of the spin base 115. Each of the chuck pins 117 includes a substrate supporting portion for supporting the peripheral edge part of the substrate W from below and a substrate holding portion for pressing an outer peripheral end face of the substrate W supported on the substrate supporting portion to hold the substrate W. Each of the chuck pins 117 is configured to be switchable between a pressing state in which the substrate holding portion presses the outer peripheral end face of the substrate W and a releasing state in which the substrate holding portion is released from the outer peripheral end face of the substrate W.

The plurality of chuck pins 117 are brought into the releasing state when the substrate W is transferred to the spin base 115, and the plurality of chuck pins 117 are brought into the pressing state when etching is carried out over the substrate W. By setting the pressing state, the plurality of chuck pins 117 can grip the peripheral edge part of the substrate W, thereby holding the substrate W in a substantially horizontal posture at a predetermined interval from the spin base 115. Consequently, the substrate W is supported with the upper surface (pattern formation surface) S1 facing upward and the back surface S2 facing downward. The member for holding the substrate is not restricted to the chuck pin but a vacuum chuck for sucking the back surface S2 to support the substrate W may be used.

The spin chuck 111 thus holding the substrate W is rotationally driven by the chuck rotating mechanism 154 to rotate the substrate W at a predetermined rotating speed, and at the same time, a processing liquid is supplied to the upper surface peripheral edge part S3 of the upper surface S1 and the back surface S2 in the substrate W through a processing liquid supply nozzle 126 and a lower nozzle 141 which will be described below, respectively. Consequently, a predetermined chemical treatment (etching) is performed.

Figure 5:
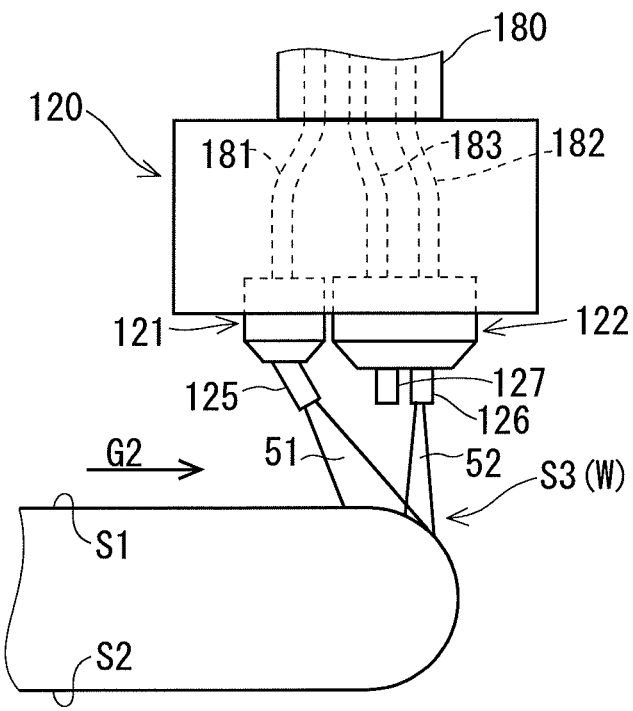
FIGS. 5 and 6 are side views each illustrating an example of a structure of the nozzle unit.
Figure 6:
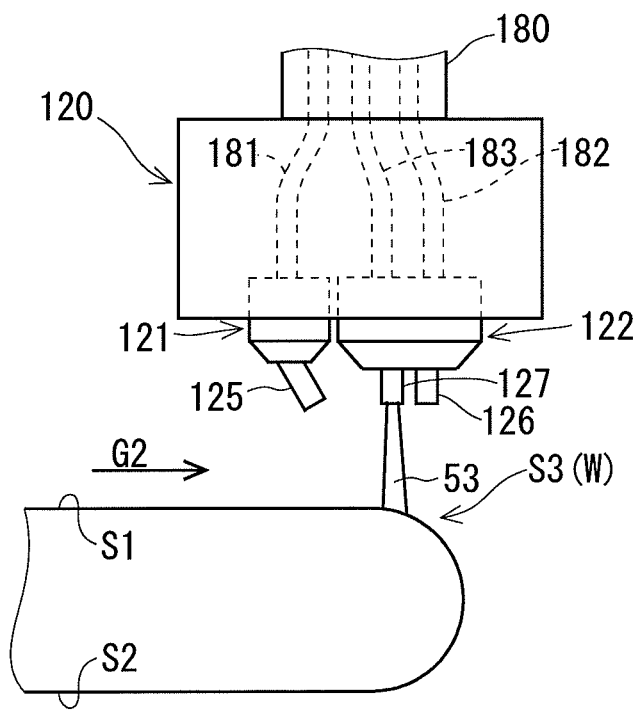

FIG. 4 is a top view schematically showing an arrangement of a nozzle unit 120 with respect to the upper surface S1 of the substrate W. For convenience of illustration, a size of the nozzle unit 120 or the like is set to be larger than an actual size with respect to the substrate W. FIGS. 5 and 6 are side views each showing an example of a structure of the nozzle unit 120.

A nozzle rotating mechanism 155 including a motor is provided on the side of the substrate W held on the spin chuck 111 as shown in FIGS. 1 and 4, and an operation of the nozzle rotating mechanism 155 is controlled by the control portion 151. A rigid tubular piping arm 180 is attached to the nozzle rotating mechanism 155 pivotably in a substantially horizontal plane with the nozzle rotating mechanism 155 set to be a rotating center.

One of ends of the piping arm 180 penetrates the nozzle rotating mechanism 155 to reach a lower surface thereof, and the other end can be positioned above the upper surface peripheral edge part S3 of the substrate W by swinging of the piping arm 180 by the nozzle rotating mechanism 155. The nozzle unit 120 is attached to the other end. In the transfer of the substrate W to the spin base 115 or the like, the piping arm 180 is swung so that the nozzle unit 120 is moved backward from a delivery-in path for the substrate W. Moreover, a position (a processing position) of the nozzle unit 120 in the execution of the etching, rinsing, or the like is adjusted so that a width of the upper surface peripheral edge part S3 to be heated, an etching width, and the like are regulated.

As shown in FIGS. 4 to 6, the nozzle unit 120 is configured to include a steam injecting portion ("a heating portion") 121 having a steam injection nozzle 125 and a processing liquid discharging portion ("a peripheral edge processing part") 122 having the processing liquid supply nozzle 126 and a rinsing liquid supply nozzle 127. Pipes 181 to 183 are connected to the steam injection nozzle 125, the processing liquid supply nozzle 126 and the rinsing liquid supply nozzle 127, respectively. The pipes 181 to 183 are disposed to pass through an inner part of the piping arm 180 via an inner part of the nozzle unit 120 and to extend below the lower surface of the nozzle rotating mechanism 155, respectively.

The pipe 181 is connected in communication with a pipe 385 from a steam supply source 131 (FIG. 1) at an outside of the substrate processing device 100. A heater 139 and an on-off valve 175 are provided in the middle part of the pipe 385 in the substrate processing device 100. The heater 139 heats steam passing through an inner part of the pipe 385 depending on control of the control portion 151. In the steam supply source 131, pure water or the like is heated so that steam for heating the peripheral edge part of the substrate W is generated. The heating steam thus generated is supplied as superheated steam having a temperature higher than 100° C. by means of the heater 139, for example.

The superheated steam at 110° C. is supplied from the steam supply source 131 to the heater 139, for example, and a temperature of the superheated steam obtained immediately after heating by the heater 139 is preferably set to be 140° C. to 160° C. or the like, for example. The steam to be supplied to the upper surface peripheral edge part S3 is cooled in a path for the supply to the nozzle unit 120, and furthermore, heat is taken by the upper surface peripheral edge part S3 also in the heating for the upper surface peripheral edge part S3 and the steam is thus cooled. However, the superheated steam having the high temperature can be maintained to have a high temperature even after being injected from the steam injection nozzle 125 and used for heating the upper surface peripheral edge part S3. Consequently, it is possible to prevent heating steam 51 from being changed into mist in the upper surface peripheral edge part S3. Therefore, the mist obtained by condensation of the steam 51 can be prevented from adhering to a non-processed region of the substrate W.

Moreover, if the superheated steam having a high temperature is used, it is possible to raise the temperature of the upper surface peripheral edge part S3 of the substrate W higher as compared with the case where saturated steam having a temperature of 100° C. or less is supplied to the steam injecting portion 121, for example. Consequently, it is possible to increase an etching rate more greatly. As shown in FIG. 5, the heating steam 51 is injected onto the upper surface peripheral edge part S3 along an injection path in an obliquely downward direction from an inside of the substrate W to an outside thereof. Consequently, the mist obtained by the condensation of the steam 51 can also be prevented from adhering to the non-processed region of the upper surface S1 due to return to the substrate W side.

The on-off valve 175 is on-off controlled by means of a valve control mechanism 152 which is controlled by the control portion 151. The valve control mechanism 152 opens the on-off valve 175 as necessary so that the heating steam 51 (FIG. 5) supplied from the steam supply source 131 to the steam injecting portion 121 is injected from the steam injection nozzle 125 of the steam injecting portion 121 to the upper surface peripheral edge part S3. In other words, the steam injecting portion 121 injects the heating steam 51 to the peripheral edge part of the substrate W, thereby heating the peripheral edge part.

Moreover, the substrate processing device 100 is also provided with a processing liquid supply source 132 for supplying an etchant (a processing liquid) which is stored therein and a rinsing liquid supply source 133 for supplying a rinsing liquid which is stored therein. As the etchant, there is applied an etchant corresponding to a type of a thin film to be removed from the peripheral edge part of the substrate W. For example, when a metal film such as a thin copper film is to be removed from the peripheral edge part of the substrate W, SC2 (a hydrochloric acid/hydrogen peroxide mixture), a mixture of hydrofluoric acid and a hydrogen peroxide solution, or nitric acid is used as the etchant. Moreover, when a polysilicon film, an amorphous silicon film, or a silicon oxide film is to be removed from the substrate W, a mixture of fluoric acid and nitric acid is used as the etchant, for example. Furthermore, when an oxide film or a nitride film on the substrate W is to be removed, fluoric acids such as DHF (diluted fluoric acid) or 50% fluoric acid are used as the etchant, for example. A temperature of the etchant is previously regulated to be a suitable temperature for a desirable etching rate, for example.

Pure water, DIW (deionized water) or the like is employed for the rinsing liquid to be supplied by the rinsing liquid supply source 133. A temperature of the rinsing liquid may be an ordinary temperature or a higher temperature in order to enhance efficiency of the rinsing, for example.

The pipe 182 connected to the processing liquid supply nozzle 126 of the processing liquid discharging portion 122 is connected in communication with a pipe 383 provided out of the processing liquid supply source 132, and an on-off valve 173 is provided in a middle part of the pipe 383. The pipe 183 connected to the rinsing liquid supply nozzle 127 of the processing liquid discharging portion 122 is connected in communication with a pipe 384 provided out of the rinsing liquid supply source 133. An on-off valve 174 is provided in a middle part of the pipe 384.

The on-off valves 173 and 174 are on-off controlled by means of a valve control mechanism 152 which is controlled by the control portion 151, and the valve control mechanism 152 selectively opens the on-off valve 173 and the on-off valve 174 as necessary. If the on-off valve 173 is opened, a processing liquid 52 (FIG. 5) supplied from the processing liquid supply source 132 is discharged from the processing liquid supply nozzle 126 of the processing liquid discharging portion 122 and is thus supplied to the upper surface peripheral edge part S3. In other words, the processing liquid discharging portion 122 supplies the processing liquid 52 from above to the peripheral edge part of the substrate W which is heated by the steam injecting portion 121, thereby carrying out a chemical treatment (etching) for the peripheral edge part.

In addition, if the on-off valve 174 is opened, a rinsing liquid 53 (FIG. 6) supplied from the rinsing liquid supply source 133 is discharged from the rinsing liquid supply nozzle 127 of the processing liquid discharging portion 122 and is thus supplied to the upper surface peripheral edge part S3. Consequently, rinsing for the peripheral edge part of the substrate W is carried out.

As described above, in the substrate processing device 100, the processing liquid 52 is supplied to the peripheral edge part (the upper surface peripheral edge part S3) of the substrate W which is heated by the injection of the heating steam 51 so that the chemical treatment (etching) for the peripheral edge part is carried out. Accordingly, it is possible to prevent the temperature of the peripheral edge part of the substrate W from being reduced by rotation. Therefore, a change (a degree of reduction) in a chemical activity of the processing liquid 52 is also reduced so that an amount of consumption of the processing liquid 52 and a processing time which are required for the chemical treatment are suppressed.

As shown in FIG. 4, the steam 51 is injected from the steam injecting portion 121 to the upper surface peripheral edge part S3 in a predetermined position (a first position) of a rotating track of the upper surface peripheral edge part S3 of the substrate W. Then, the processing liquid 52 is supplied from the processing liquid discharging portion 122 to the upper surface peripheral edge part S3 in another predetermined position (a second position) placed behind the predetermined position along the rotating track. Accordingly, the processing liquid 52 is supplied from the processing liquid discharging portion 122 to a portion of the upper surface peripheral edge part S3 heated by the steam injecting portion 121 immediately after the heating. Thereafter, etching for the portion is carried out. Thus, the temperature of the upper surface peripheral edge part S3 heated by the steam injecting portion 121 is prevented from being reduced, and at the same time, the etching for the upper surface peripheral edge part S3 is carried out. Therefore, the etching rate can be enhanced.

Returning to FIG. 1, a through hole connected to a through hole of the rotating support shaft 113 is formed on a central part of the spin base 115. A cylindrical portion 143 is inserted into these through holes. A substantially disk-shaped lower nozzle 141 (also referred to as "a lower surface processing portion") is fixed to an upper end of the cylindrical portion 143. A processing liquid discharging port 148 is formed on the lower nozzle 141. The processing liquid discharging port 148 has an opening on a central part of an upper surface (an opposed surface) 145 and penetrates the lower nozzle 141. The processing liquid discharging port 148 is connected in communication with a supply tube 147 to be a through hole formed by an internal wall of the cylindrical portion 143. The lower nozzle 141 supplies the processing liquid to be fed via the supply tube 147 from the processing liquid discharging port 148 to the back surface S2 of the substrate W, thereby carrying out the etching (the chemical treatment) for the back surface S2.

A diameter of the lower nozzle 141 is set to be smaller than a diameter of the rotating track of the chuck pin 117 in such a manner that the chuck pin 117 erected on the rotating spin base 115 does not interfere with the lower nozzle 141. The upper surface 145 of the lower nozzle 141 is an opposed surface which is opposed to a substantially entire region of the back surface S2 of the substrate W to be rotated by the chuck rotating mechanism 154. Moreover, the upper surface 145 of the lower nozzle 141 takes a shape of a funnel in which an opening portion of the supply tube 147 has a greater interval from the back surface S2 of the substrate W than a portion opposed to the peripheral edge part of the substrate W.

The processing liquid is supplied from the processing liquid supply source 132 through a pipe 386 to the supply tube 147 connected to the processing liquid discharging port 148 of the lower nozzle 141, and the rinsing liquid is supplied thereto from the rinsing liquid supply source 133 through a pipe 388. On-off valves 176 and 178 are provided in the middle parts of the pipes 386 and 388, respectively. The on-off valves 176 and 178 are on-off controlled by means of the valve control mechanism 152. The valve control mechanism 152 selectively opens the on-off valve 176 and the on-off valve 178 so that the processing liquid and the rinsing liquid are selectively supplied to the supply tube 147 and are selectively discharged from the processing liquid discharging port 148 on the upper surface 145 of the lower nozzle 141 toward the back surface S2 of the substrate W.

Figure 7:
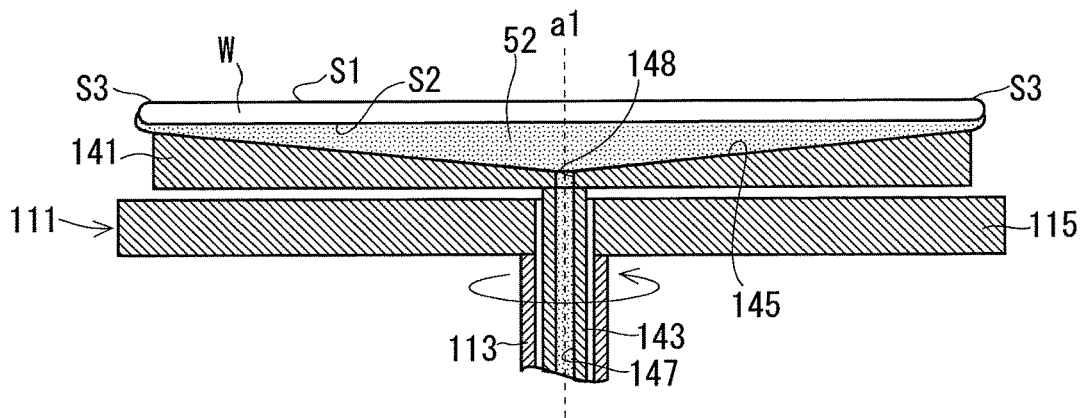
FIGS. 7 to 9 are views for explaining processing for a back surface of a substrate through a lower nozzle.
Figure 8:
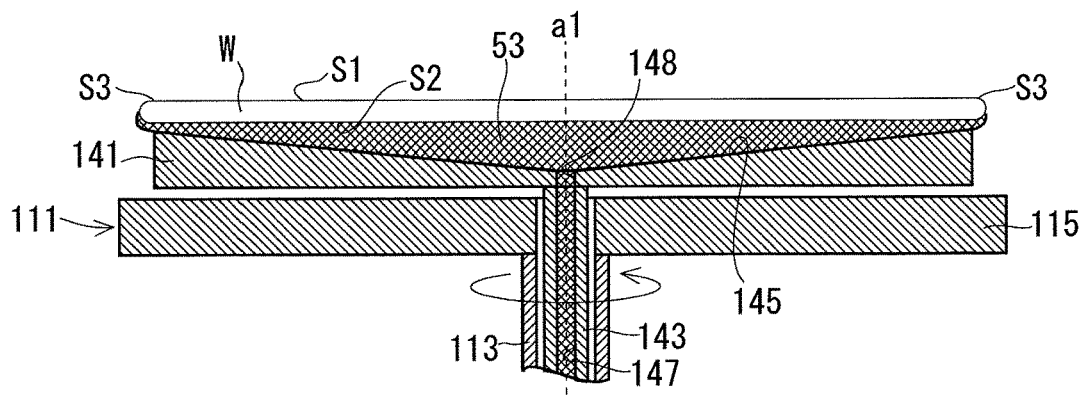
Figure 9:
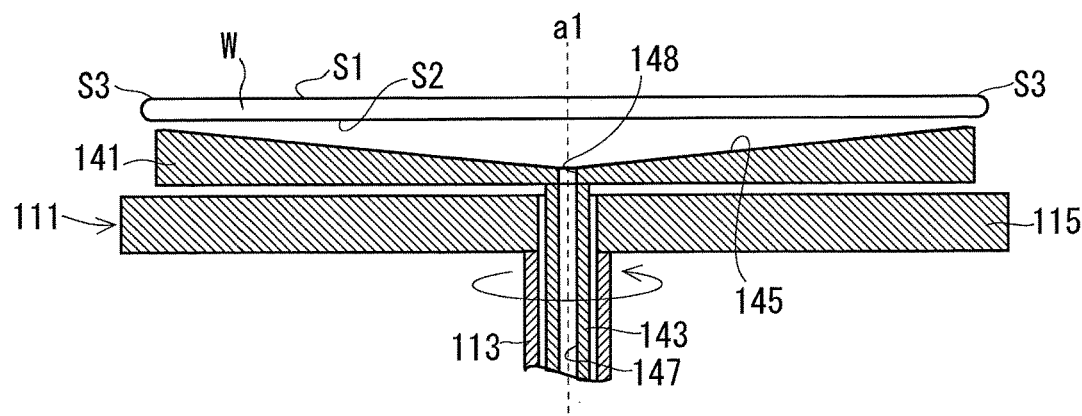

FIGS. 7 to 9 are sectional views showing the spin chuck 111, the lower nozzle 141, and the like for explaining the processing for the back surface S2 of the substrate W through the lower nozzle 141. These sectional views illustrate a portion in which the chuck pin 117 is not erected on the spin base 115. FIG. 7 shows a state in which a space 149 (FIG. 1) between the back surface S2 of the substrate W and the upper surface 145 of the lower nozzle 141 is set to a fluid-tight condition with the processing liquid 52, and FIG. 8 shows a state in which the space 149 is set to the fluid-tight condition with the rinsing liquid 53. Moreover, FIG. 9 shows a state in which neither the processing liquid 52 nor the rinsing liquid 53 is present in the space 149.

The upper surface 145 of the lower nozzle 141 is opposed to the substantially entire region of the back surface S2 of the substrate W to be rotated by the chuck rotating mechanism 154. Therefore, as shown in FIG. 7, the processing liquid 52 discharged from the supply tube 147 to the back surface S2 brings the space ("a gap portion") 149 (see FIG. 1) between the back surface S2 of the substrate W and the upper surface 145 into the fluid-tight condition. Consequently, even if the substrate W is rotated at a low speed, the processing liquid 52 is supplied to the entire region of the back surface S2 of the substrate W. Thus, the temperature of the peripheral edge part of the substrate W can be prevented from being reduced. Accordingly, also in the case where the etching for each of the upper surface peripheral edge part S3 and the back surface S2 of the substrate W is carried out at the same time, it is possible to perform the etching (the chemical treatment) for the upper surface peripheral edge part S3 and the back surface S2 of the substrate W with a small amount of processing liquid 52 (FIGS. 5 and 7) while suppressing energy required for heating the peripheral edge part of the substrate W. Moreover, it is possible to suppress the rotating speed of the substrate W. Therefore, it is possible to inhibit wraparound of the processing liquid from the back surface S2 to the upper surface peripheral edge part S3 in the substrate W. Consequently, it is easy to control a chemical treating width (an etching width) of the upper surface peripheral edge part S3.

Moreover, also in the case where the rinsing liquid is discharged from the supply tube 147 as shown in FIG. 8, the space 149 is brought into the fluid-tight condition with the rinsing liquid so that the rinsing for the back surface S2 can be carried out in the same manner as in the case where the processing liquid is discharged.

As shown in FIG. 1, the substrate processing device 100 also includes a suction mechanism 158 having a suction pump below the rotating support shaft 113. An operation of the suction mechanism 158 is controlled by the control portion 151. The supply tube 147 of the cylindrical portion 143 and the suction mechanism 158 are connected to each other through a pipe 389, and an on-off valve 179 performing an on-off operation to be controlled by the valve control mechanism 152 is provided in the middle part of the pipe 389. When the on-off valve 179 is opened, the processing liquid or the rinsing liquid present in the space 149 between the back surface S2 and the upper surface 145 is sucked by the suction mechanism 158 and collected as shown in FIG. 9.

Moreover, as shown in FIG. 1, a nitrogen gas is supplied through a pipe 387 from a nitrogen gas supply source 134 at an outside of the substrate processing device 100 to the supply tube 147. An on-off valve 177 to be on-off controlled by the valve control mechanism 152 is provided in the middle part of the pipe 387. When the control portion 151 opens the on-off valve 177 through the valve control mechanism 152, the nitrogen gas is supplied to the back surface S2 of the substrate W which is being rotated with the rinsing liquid collected by the suction mechanism 158.

Great centrifugal force acts on the rinsing liquid adhered to the back surface S2 by the rotation of the substrate W so that the rinsing liquid is shaken off toward the periphery of the substrate W and a drying treatment for the back surface S2 is carried out. Moreover, the back surface S2 is also promoted to be dried with the nitrogen gas supplied to the back surface S2, and the rinsing liquid shaken off toward the periphery of the substrate W is also inhibited from returning to the substrate W side. The upper surface 145 of the lower nozzle 141 takes the shape of the funnel described above. Therefore, it is easy to collect the processing liquid or the rinsing liquid supplied to the back surface S2 of the substrate W. Thus, the rinsing liquid is promoted to be dried over the back surface S2.

In addition, a gas injection head ("a gas injecting portion") 200 is provided above a substantially central part of the substrate W. A gas supply path 282 penetrating a central part of the gas injection head 200 in a vertical direction is formed in the gas injection head 200, and a buffer space BF is formed in the gas injection head 200. A gas supply path 283 is formed on a side of the gas supply path 282. The gas supply path 283 has an opening on an upper surface side of the gas injection head 200 and is caused to communicate with the buffer space BF. Furthermore, a gas injection port communicating with the buffer space BF is provided in an outer peripheral part of a lower surface of the gas injection head 200. The openings on the upper parts of the gas supply paths 282 and 283 are connected to the nitrogen gas supply source 134 by means of pipes 381 and 382 through which on-off valves 171 and 172 are inserted, respectively.

The on-off valves 171 and 172 are on-off controlled by the valve control mechanism 152 which is controlled by the control portion 151, and are opened as necessary so that the nitrogen gas is supplied from the nitrogen gas supply source 134 to the gas supply paths 282 and 283 in the gas injection head 200, respectively. The nitrogen gas supplied to the gas supply path 282 is injected as a nitrogen gas G1 (a gas for purge) from the opening of the gas supply path 282 provided on the lower surface side of the gas injection head 200 to the upper surface S1 of the substrate W.

In more detail, the nitrogen gas G1 is injected from the gas supply path 282 provided above the substrate W toward a predetermined injection target region defined within a range surrounded by the rotating track of the upper surface peripheral edge part S3 in the upper surface S1 of the substrate W. Then, the nitrogen gas G1 injected to the upper surface S1 forms a gas flow which flows from the injection target region toward the upper surface peripheral edge part S3 of the substrate W. With the gas flow formed by the nitrogen gas G1, the mist obtained by the condensation of the steam 51 injected from the steam injecting portion 121 to the upper surface peripheral edge part S3, the processing liquid 52 discharged from the processing liquid supply nozzle 126 of the processing liquid discharging portion 122 or the like can be prevented from adhering onto a non-processed region in which the etching is not carried out in the upper surface S1 of the substrate W. Accordingly, it is possible to supply a sufficient amount of steam for heating the peripheral edge part of the substrate W while suppressing deterioration in the non-processed region due to the adhering of the mist.

Moreover, also in a drying treatment for the upper surface S1 of the substrate W after the end of the rinsing, the substrate W is promoted to be dried with the nitrogen gas G1 supplied from the gas supply path 282, and furthermore, the rinsing liquid shaken off from the upper surface peripheral edge part S3 toward the outside of the substrate W by the centrifugal force acting through the rotation of the substrate W can also be prevented from returning to the substrate W and adhering onto the non-processed region of the upper surface S1.

The nitrogen gas supplied to the gas supply path 283 is injected as a nitrogen gas G2 (a gas for curtain) from a gas injection port formed on the outer peripheral part of the lower surface of the gas injection head 200 to the upper surface S1 via the buffer space BF. Consequently, the nitrogen gas G1 injected to the upper surface S1 of the substrate W is supplied toward the upper surface peripheral edge part S3 along the upper surface S1 of the substrate W. Therefore, it is possible to efficiently prevent the non-processed region from being deteriorated by the adhering of the mist or the like.

The gas injection head 200 is held above the spin base 115 by means of an arm (not shown), while the arm is configured to be upward and downward movable in connection with a head up-down mechanism 153 to be controlled by the control portion 151. With this structure, when the etching for the substrate W or the like is to be carried out, the gas injection head 200 is positioned at a predetermined interval (for example, approximately 2 to 10 mm) opposite to the upper surface S1 of the substrate W held in the spin chuck 111. Moreover, when the substrate W is transferred to the spin chuck 111 or is received from the spin chuck 111, the gas injection head 200 is moved upward from the spin chuck 111.

2. Operation of Substrate Processing Device

Figure 10:
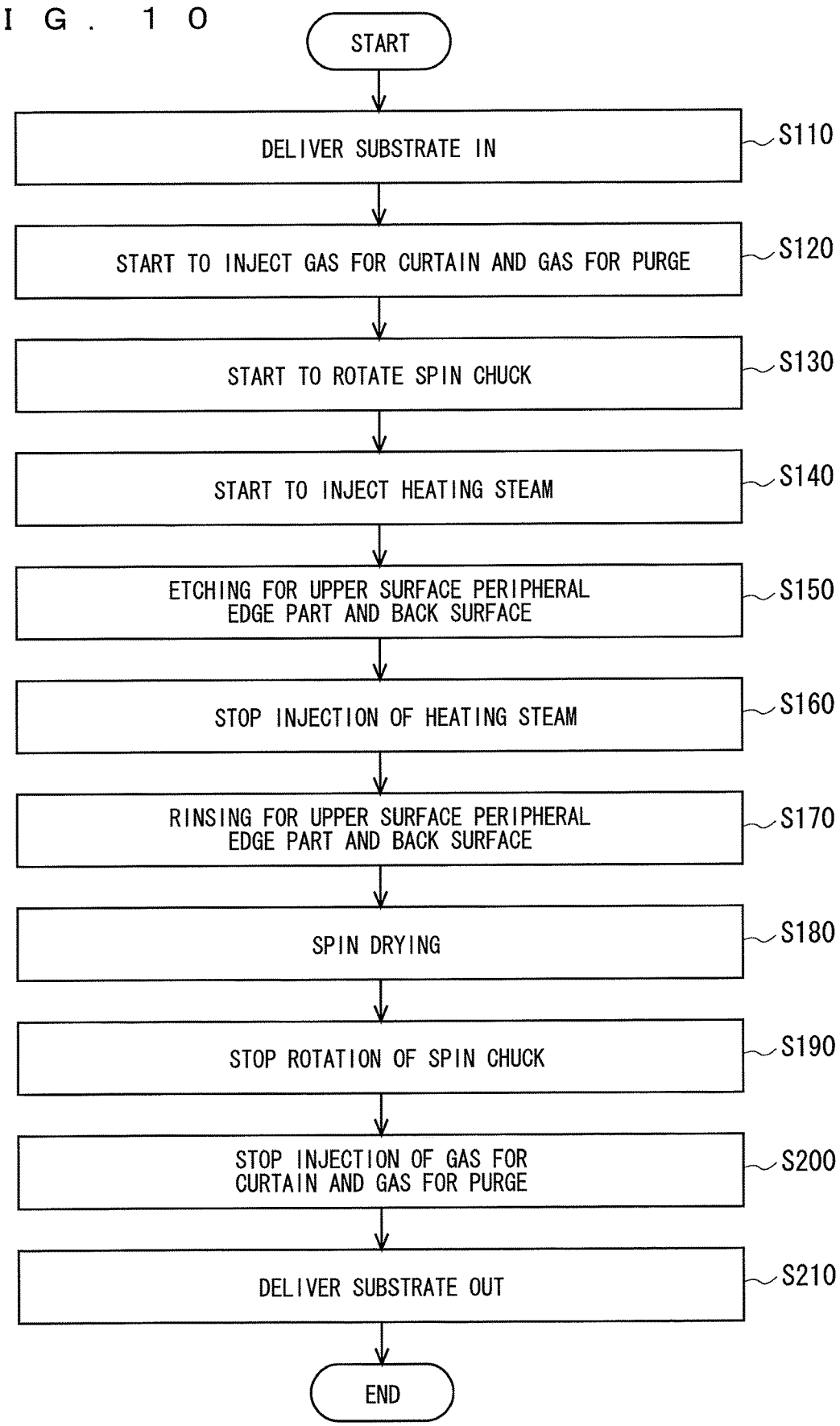
FIG. 10 is a flow chart showing an example of a flow of substrate processing according to a first preferred embodiment.

FIG. 10 is a flow chart showing an example of a flow of substrate processing to be carried out by the substrate processing device 100 according to the first preferred embodiment. Before the start of the processing, each of the on-off valves is closed and the spin chuck 111 is stationary. Moreover, the gas injection head 200 is moved backward to a predetermined separating position and the nozzle unit 120 is placed in a standby position other than a delivery-in path for the substrate W. First of all, a single substrate W is delivered by a substrate delivery robot (not shown) into a processing chamber (chamber) (not shown) in which the spin chuck 111 is disposed, and is mounted on the spin chuck 111 to be held by the chuck pin 117 (step S110).

Subsequently, the gas injection head 200 is moved downward to a processing position placed above the upper surface S1 of the substrate W at a predetermined interval (for example, approximately 2 to 10 mm) by means of the head up-down mechanism 153. Then, the on-off valves 171 and 172 are opened sand the gas injection head 200 injects the nitrogen gas supplied from the nitrogen gas supply source 134 as the nitrogen gas G1 (the gas for purge) and the nitrogen gas G2 (the gas for curtain) onto the upper surface S1 of the substrate W (step S120).

Next, the nozzle unit 120 is positioned above the upper surface peripheral edge part S3 of the substrate W and the control portion 151 controls the chuck rotating mechanism 154 so that the rotation of the spin chuck 111 is started at a predetermined rotating speed of 50 rpm to 1000 rpm, for example (step S130). Then, the on-off valve 175 is opened so that the heating steam generated by the steam supply source 131 and heated by the heater 139 is supplied to the nozzle unit 120. The nozzle unit 120 starts the injection of the heating steam from the steam injection nozzle 125 toward the upper surface peripheral edge part S3 (step S140), thereby starting to heat the upper surface peripheral edge part S3.

Subsequently, the etching for the upper surface peripheral edge part S3 and the back surface S2 of the substrate W is carried out (step S150). More specifically, the on-off valve 173 is opened, and the processing liquid is supplied from the processing liquid supply source 132 to the nozzle unit 120 and discharged from the processing liquid supply nozzle 126 to the upper surface peripheral edge part S3 which is heated. Then, the etching for the upper surface peripheral edge part S3 of the substrate W is carried out with the discharged processing liquid.

Moreover, in parallel with the etching for the upper surface peripheral edge part S3, the on-off valve 176 is opened so that the processing liquid supplied from the processing liquid supply source 132 is discharged from the processing liquid discharging port of the lower nozzle 141 toward the back surface S2 of the substrate W via the supply tube 147 of the cylindrical portion 143. Consequently, as shown in FIG. 7, the space 149 between the back surface S2 of the substrate W and the lower nozzle 141 is brought into a fluid-tight condition with the processing liquid 52, and the etching for the back surface S2 is carried out.

When a predetermined time elapsed and the etching for the upper surface peripheral edge part S3 and the back surface S2 is completed, the on-off valve 175 and the on-off valve 176 are closed so that the supply of the processing liquid to the substrate W is stopped. Then, the on-off valve 175 is closed so that the injection of the heating steam is stopped (step S160). Subsequently, the on-off valve 179 is opened so that the suction mechanism 158 is driven, and the processing liquid accumulated in the space 149 between the back surface S2 of the substrate W and the upper surface 145 of the lower nozzle 141 is sucked and collected. When the collection of the processing liquid is completed, the on-off valve 179 is closed so that the suction mechanism 158 is stopped.

Next, the rinsing for the upper surface peripheral edge part S3 and the back surface S2 of the substrate W is carried out (step S170). More specifically, the on-off valves 174 and 178 are opened and the supply of the rinsing liquid from the rinsing liquid supply source 133 is started. Thereafter, the rinsing liquid is discharged from the rinsing liquid supply nozzle 127 of the nozzle unit 120 to the upper surface peripheral edge part S3 to carry out the rinsing for the upper surface peripheral edge part S3, and furthermore, the rinsing liquid is supplied from the processing liquid discharging port of the lower nozzle 141 to the back surface S2.

The space 149 between the substrate W and the lower nozzle 141 is brought into the fluid-tight condition with the rinsing liquid 53 supplied from the lower nozzle 141 as shown in FIG. 8. Thus, the rinsing for the back surface S2 of the substrate W is carried out. When a predetermined time elapsed and the rinsing for the upper surface peripheral edge part S3 and the back surface S2 is completed, the on-off valves 174 and 178 are closed so that the supply of the rinsing liquid is stopped. Thereafter, the on-off valve 179 is opened so that the suction mechanism 158 is driven and the rinsing liquid accumulated in the space 149 between the substrate W and the lower nozzle 141 is sucked and collected. When the collection of the rinsing liquid is completed, the on-off valve 179 is closed so that the suction mechanism 158 is stopped.

Subsequently, the rotating speed of the spin chuck 111 is raised to be high, that is, 1000 to 1500 rpm, for example, in such a manner that the centrifugal force acting on the rinsing liquid remaining in the upper surface peripheral edge part S3 and the back surface S2 is increased. Consequently, the remaining rinsing liquid is shaken off to the outside of the substrate W so that a drying treatment (spin drying) for the upper surface S1 and the back surface S2 of the substrate W is carried out (step S180). In the spin drying, the on-off valve 177 is opened and the nitrogen gas supplied from the nitrogen gas supply source 134 is injected from the processing liquid discharging port of the lower nozzle 141 to the back surface S2 of the substrate W, while the supply of the nitrogen gases G1 and G2 from the gas injection head 200 to the upper surface peripheral edge part S3 is continuously carried out. Consequently, the rinsing liquid adhered onto the upper surface peripheral edge part S3 and the back surface S2 can be promoted to be dried, and furthermore, the shaken-off rinsing liquid can be prevented from returning to the substrate W side and adhering onto the non-processed region of the upper surface S1.

When a predetermined time elapsed since the start of the drying treatment, the rotation of the spin chuck 111 is stopped so that the drying treatment is ended (step S190). Subsequently, the on-off valves 171 and 172 are closed so that the injection of the nitrogen gas G1 (the gas for purge) and the nitrogen gas G2 (the gas for curtain) from the gas injection head 200 is stopped (step S200).

When the injection of the gas from the gas injection head 200 is stopped, the control portion 151 controls the head up-down mechanism 153 to lift the gas injection head 200 to a predetermined separating position, and controls the nozzle rotating mechanism 155 to move the nozzle unit 120 to a standby position. Then, the processed substrate W is removed from the spin chuck 111 and is delivered to the outside of the processing chamber by means of a delivery robot (not shown) (step S210), and the substrate processing carried out by the substrate processing device 100 is ended.

According to the substrate processing device in accordance with the first preferred embodiment configured as described above, the processing liquid is supplied to the upper surface peripheral edge part S3 of the substrate W heated by the injection of the heating steam so that the chemical treatment (the etching) for the upper surface peripheral edge part S3 is carried out. Therefore, the temperature of the peripheral edge part of the substrate W can be prevented from being reduced by the rotation. Consequently, a change in a chemical activity (a degree of reduction) of the processing liquid is also reduced so that an amount of consumption of the processing liquid and a time required for the processing are suppressed. Moreover, the substrate processing device injects the gas (the nitrogen gas G1) from above the substrate W toward a predetermined injection target region defined within a range surrounded by the rotating track of the upper surface peripheral edge part S3 of the substrate W in the upper surface S1 of the substrate W, thereby generating, on the substrate W, a gas flow which flows from the injection target region toward the upper surface peripheral edge part S3 of the substrate W. Consequently, the mist obtained by the condensation of the steam or the mist-like processing liquid can be prevented from adhering onto the non-processed region in the upper surface S1 of the substrate W. Accordingly, it is possible to supply a sufficient amount of steam for heating the peripheral edge part of the substrate W while inhibiting the non-processed region from being deteriorated by the adhering of the mist.

Moreover, according to the substrate processing device in accordance with the first preferred embodiment configured as described above, the processing liquid is discharged from the processing liquid discharging port of the lower nozzle 141 having the upper surface 145 (the opposed surface) which is opposed to the substantially entire region of the back surface S2 of the rotated substrate W, and the space 149 between the back surface S2 of the substrate W and the opposed surface is thus brought into the fluid-tight condition with the processing liquid. For this reason, even if the substrate W is rotated at a low speed, the processing liquid can be supplied to the entire region of the back surface S2 of the substrate W. Consequently, it is possible to carry out the chemical treatment (the etching) for the upper surface peripheral edge part S3 and the back surface S2 of the substrate W while inhibiting reduction in the temperature of the peripheral edge part of the substrate W to suppress energy required for heating the peripheral edge part. Moreover, it is possible to prevent the wraparound of the processing liquid from the back surface S2 of the substrate W to the upper surface peripheral edge part S3 in the upper surface S1 by suppressing the rotating speed of the substrate W. Thus, it is easy to control the processing width of the upper surface peripheral edge part S3.

Moreover, according to the substrate processing device in accordance with the first preferred embodiment configured as described above, the upper surface 145 (the opposed surface) of the lower nozzle 141 takes a shape of a funnel in which the processing liquid discharging port 148 portion of the lower nozzle 141 has a greater interval from the back surface S2 of the substrate W than the portion opposed to the peripheral edge part of the substrate W. Accordingly, it is easy to collect the processing liquid or the rinsing liquid which is supplied to the back surface S2 of the substrate W. Therefore, during the drying treatment for the back surface S2, the rinsing liquid adhered onto the back surface S2 and remaining thereon is promoted to be dried.

Furthermore, according to the substrate processing device in accordance with the first preferred embodiment configured as described above, the steam injecting portion 121 and the processing liquid discharging portion 122 are provided in a positional relationship in which the heating steam is injected from the steam injecting portion 121 to the upper surface peripheral edge part S3 in a first position of the rotating track of the upper surface peripheral edge part S3 of the substrate W and the processing liquid is supplied from the processing liquid discharging portion 122 to the upper surface peripheral edge part S3 in a second position placed behind the first position along the rotating track. Accordingly, the processing liquid 52 is supplied from the processing liquid discharging portion 122 to the upper surface peripheral edge part S3 portion heated by the steam injecting portion 121 immediately after the heating. Then, the etching for the portion is carried out. The etching is carried out for each of the portions of the upper surface peripheral edge part S3 heated by the steam injecting portion 121 while the temperature is prevented from being reduced. Therefore, the etching rate can be enhanced.

In the substrate processing device 100, for example, the nitrogen gas supply source 134 and the steam supply source 131 may be provided in the substrate processing device 100. Moreover, it is also possible to employ a structure in which a dry gas such as dry air or an inert gas other than the nitrogen gas is supplied in place of the supply of the nitrogen gas through the nitrogen gas supply source 134. Furthermore, since a heating mechanism is provided to heat the inert gas, it is also possible to further prevent the reduction in the temperature, thereby promoting the rinsing liquid to be dried. Moreover, although the respective nozzles or the like in the nozzle unit 120 are integrally moved with the substrate W, they may be individually movable, respectively. In addition, the etching for the upper surface peripheral edge part S3 of the substrate W and the etching for the back surface S2 may be sequentially carried out. Furthermore, among the nozzle unit 120 and the lower nozzle 141, even if the substrate processing device 100 includes only the nozzle unit 120 and carries out only the etching for the upper surface peripheral edge part S3 among the etching for the upper surface peripheral edge part S3 and the etching for the back surface S2, the usefulness of the present invention is not lost. Furthermore, in place of the gas injection head 200, a blocking plate may be employed to supply the nitrogen gas from the blocking plate to the upper surface S1 of the substrate W. Moreover, in the explanation of the flow of the substrate processing carried out by the substrate processing device 100 with reference to FIG. 10, the nozzle unit 120 is positioned above the upper surface peripheral edge part S3 of the substrate W and the rotation of the spin chuck 111 is started, and the nozzle unit 120 then starts the injection of the heating steam. However, for example, the spin chuck 111 may start the rotation and the nozzle unit 120 may then start the injection of the heating steam, and thereafter, the nozzle unit 120 may be positioned above the upper surface peripheral edge part S3 of the substrate W.

Referring to Second Preferred Embodiment

3. Structure of Substrate Processing Device

FIG. 11 is a view schematically showing an example of a schematic structure of a substrate processing device 600 according to a second preferred embodiment. The substrate processing device 600 carries out a chemical treatment for a substrate by using a processing liquid having a reaction rate increased with a rise in temperature. More specifically, the substrate processing device 600 performs etching for a peripheral edge part (also referred to as "a upper surface peripheral edge part") S3 of a substrate W6 such as a semiconductor wafer in a front surface (also referred to as "an upper surface") 51 of the substrate W6 by using an etchant as a processing liquid for the chemical treatment, thereby removing a thin film (an unnecessary object) formed on a upper surface peripheral edge part S8. The upper surface peripheral edge part S8 is a ring-shaped region having a width of 0.5 to 3.0 mm from a peripheral edge of the substrate W6 in the upper surface S6 of the substrate W6, for example. A back surface S7 at a side opposite to the upper surface S6 will also be referred to as "a lower surface". A surface shape of the substrate W6 is substantially circular, and the upper surface S6 of the substrate W6 implies a device formation surface on which a device pattern is to be formed.

As described above, in addition to the etchant to be used in the etching, most of chemical processing liquids conform to the general Arrhenius equation in which a reaction rate is increased with a rise in temperature. In other words, most of processing liquids belong to "a processing liquid having a reaction rate increased with a rise in temperature".

Figure 20:
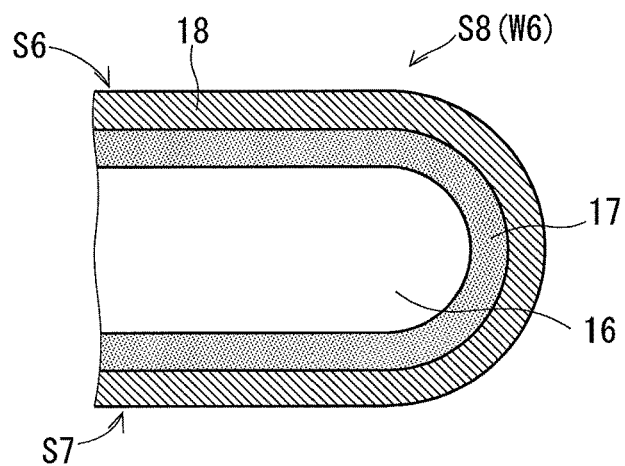
FIG. 20 is a view showing an example of a sectional view of the substrate.

FIG. 20 is a view showing an example of a sectional view of the substrate W6. As shown in FIG. 20, a central layer 16 of the substrate W6 is constituted by silicon (Si). An insulating film which does not conduct electricity, for example, a thermal oxide film (Th-SiO$_2$), Hf (hafnium), Hf oxide, or the like is formed as a lower film (also referred to as "a ground layer") 17 over the central layer 16. Then, over the lower film 17, a barrier metal film such as a TiN film or a TaN film or a metal film such as an Al film, a W film, a NiSi film, or a Cu film is formed as an upper film (also referred to as "an upper layer") 18. In the substrate W6, the upper film 18 in a region (a processed region) at a peripheral edge side in the upper surface peripheral edge part S8 is removed by etching. For example, a substrate having only the lower film 17 formed on the central layer 16 may be employed as the substrate W6, and the lower film 17 in the processed region of the upper surface peripheral edge part may be removed.

As shown in FIG. 11, the substrate processing device 600 includes a spin chuck ("a substrate holding portion") 611 for holding and rotating the substrate W6 in a substantially horizontal posture with the upper surface S6 facing upward. The spin chuck 611 has a cylindrical rotating support shaft 613 coupled to a rotating axis of a chuck rotating mechanism ("a rotating portion") 654 including a motor, and is rotatable around a rotating axis a6 (a vertical axis), that is, in a substantially horizontal plane by a driving operation of the chuck rotating mechanism 654.

A disk-shaped spin base 615 is integrally coupled to an upper end of the rotating support shaft 613 by means of a fastening component such as a screw. Accordingly, the chuck rotating mechanism 654 is operated in response to an operation command sent from a control portion 651 for controlling the entire device so that the spin base 615 is rotated around the rotating axis a6. Moreover, the control portion 651 controls the chuck rotating mechanism 654 to regulate a rotating speed. The control portion 651 is implemented through execution of a program stored in a memory by a CPU or the like, for example.

A plurality of chuck pins 617 for gripping the peripheral edge part of the substrate W6 is erected in the vicinity of the peripheral edge part of the spin base 615. It is sufficient that at least three chuck pins 617 are provided in order to reliably hold the circular substrate W6, and the chuck pins 617 are disposed at an equal angle interval along the peripheral edge part of the spin base 615. Each of the chuck pins 617 includes a substrate supporting portion for supporting the peripheral edge part of the substrate W6 from below and a substrate holding portion for pressing an outer peripheral end face of the substrate W6 supported on the substrate supporting portion to hold the substrate W6. Each of the chuck pins 617 is configured to be switchable between a pressing state in which the substrate holding portion presses the outer peripheral end face of the substrate W6 and a releasing state in which the substrate holding portion is released from the outer peripheral end face of the substrate W6.

The plurality of chuck pins 617 are brought into the releasing state when the substrate W6 is transferred to the spin base 615, and the plurality of chuck pins 617 are brought into the pressing state when etching is carried out over the substrate W6. By setting the pressing state, the chuck pins 617 can grip the peripheral edge part of the substrate W6 to hold the substrate W6 in a substantially horizontal posture at a predetermined interval from the spin base 615. Consequently, the substrate W6 is supported with the upper surface (pattern formation surface) S1 facing upward and the back surface S7 facing downward. As a member for holding the substrate W6, it is also possible to use a vacuum chuck which sucks the back surface S7 to support the substrate W6, in addition to a member using a chuck pin.

The spin chuck 611 thus holding the substrate W6 is rotationally driven by the chuck rotating mechanism 654 to rotate the substrate W6 at a predetermined rotating speed, and at the same time, a processing liquid is supplied to the upper surface peripheral edge part S8 of the upper surface S6 of the substrate W6 through a processing liquid supply nozzle 626 which will be described below. Consequently, a predetermined chemical treatment (etching) is performed.

Figure 14:
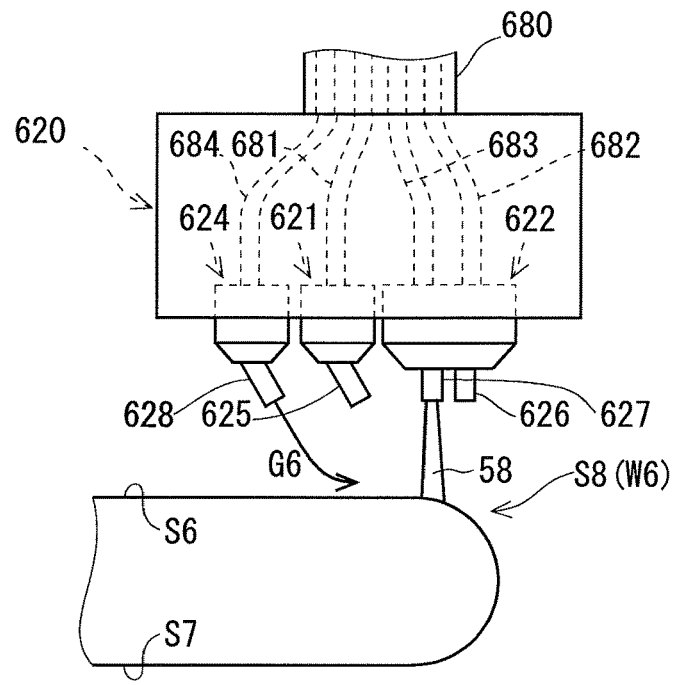
Figure 15:
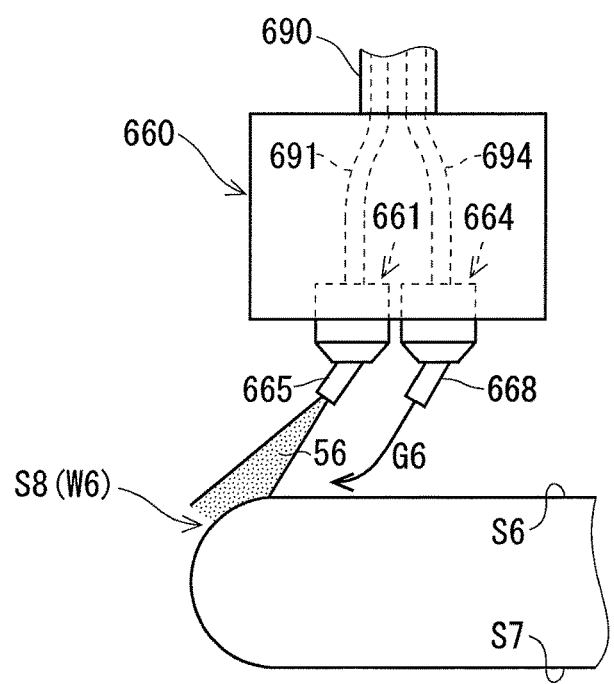

FIG. 12 is a top view schematically showing the arrangement of a nozzle unit 620 (660) with respect to the upper surface S6 of the substrate W6. For convenience of illustration, a size of the nozzle unit 620 (660) is illustrated to be larger than an actual size with respect to the substrate W6. FIGS. 13 and 14 are side views showing an example of a structure of the nozzle unit 620. FIG. 15 is a side view showing an example of a structure of the nozzle unit 660.

As shown in FIGS. 11 and 12, nozzle rotating mechanisms 655 and 656 including motors are provided on the side of the substrate W6 held on the spin chuck 611, and operations of the nozzle rotating mechanisms 655 and 656 are controlled by the control portion 651. A rigid tubular piping arm 680 (690) is pivotably attached to the nozzle rotating mechanism 655 (656) in a substantially horizontal plane with the nozzle rotating mechanism 655 (656) set to be a rotating center.

One of ends of the piping arm 680 (690) penetrates the nozzle rotating mechanism 655 (656) to reach a lower surface thereof, and the other end can be positioned above the upper surface peripheral edge part S8 of the substrate W6 by swinging of the piping arm 680 (690) through the nozzle rotating mechanism 655 (656). The nozzle unit 620 (660) is attached to the other end. Upon the transfer of the substrate W6 to the spin base 615 or the like, the piping arm 680 (690) is swung so that the nozzle unit 620 (660) is moved backward from a delivery-in path for the substrate W6. Moreover, a position (a processing position) of the nozzle unit 620 (660) upon execution of etching, rinsing, or the like is accurately adjusted by servo control so that a width of the upper surface peripheral edge part S8 to be heated, an etching width, or the like is regulated.

As shown in FIGS. 12 to 14, the nozzle unit 620 is configured to include a heating portion 621 having a steam injection nozzle 625, a processing liquid discharging portion ("a peripheral edge processing portion") 622 having a processing liquid supply nozzle 626 and a rinsing liquid supply nozzle 627, and a nitrogen gas injecting portion 624 having a nitrogen gas injection nozzle 628. Pipes 681 to 684 are connected to the steam injection nozzle 625, the processing liquid supply nozzle 626, the rinsing liquid supply nozzle 627, and the nitrogen gas injection nozzle 628, respectively. The pipes 681 to 684 are disposed to pass through an inner part of the piping arm 680 via an inner part of the nozzle unit 620 and to extend below the lower surface of the nozzle rotating mechanism 655, respectively.

Moreover, as shown in FIG. 15, the nozzle unit 660 is configured to include a heating portion 661 having a steam injection nozzle 665 and a nitrogen gas injecting portion 664 having a nitrogen gas injection nozzle 668. Pipes 691 and 694 are connected to the steam injection nozzle 665 and the nitrogen gas injection nozzle 668, respectively. The pipes 691 and 694 are disposed to pass through an inner part of the piping arm 690 via an inner part of the nozzle unit 660 and to extend below the lower surface of the nozzle rotating mechanism 656, respectively. As shown in FIGS. 12 to 15, the heating portions 621 and 661 are disposed to be opposed to two different positions from each other in the rotating track of the peripheral edge part of the substrate W6, respectively.

As shown in FIG. 11, a steam supply source 631 provided on the outside of the substrate processing device 600 is connected in communication with a pipe 885. A heater 639 and an on-off valve 675 are provided in the middle part of the pipe 885 in the substrate processing device 600. The pipe 885 branches into two parts at a downstream side (the spin chuck 611 side) of the on-off valve 675. One of the branching pipes 885 is connected in communication with the pipe 681 (FIG. 13) and the other is connected in communication with the pipe 691 (FIG. 15).

The heater 639 heats steam passing through the inside of the pipe 885 depending on the control of the control portion 651. In the steam supply source 631, pure water or the like is heated so that steam for heating the peripheral edge part of the substrate W6 is generated. The heating steam thus generated is supplied as superheated steam having a temperature higher than 100° C. by the heater 639, for example.

The superheated steam at 110° C. is supplied from the steam supply source 631 to the heater 639, for example, and a temperature of the superheated steam obtained immediately after heating by the heater 639 is preferably set to be 140° C. to 160° C. or the like, for example. The steam to be supplied to the upper surface peripheral edge part S8 is cooled in a path for the supply to the nozzle unit 620 (660), and furthermore, is cooled by taking heat through the upper surface peripheral edge part S8 also during the heating for the upper surface peripheral edge part S8. However, the superheated steam having a high temperature is injected through the steam injection nozzle 625 (665) and can also be maintained to have the high temperature also after it is used for heating the upper surface peripheral edge part S8. It is possible to suppress a change of heating steam 56 (FIGS. 13 and 15) into mist in the upper surface peripheral edge part S8. Accordingly, the mist obtained by the condensation of the steam 56 can be prevented from adhering onto the non-processed region of the substrate W6.

Moreover, if the superheated steam having the high temperature is used, the temperature of the upper surface peripheral edge part S8 of the substrate W6 can be raised more greatly as compared with the case where saturated steam having a temperature of 100° C. or less is supplied to the heating portion 621 (661), for example. Thus, the etching rate can be increased more greatly. As shown in FIG. 13 (FIG. 15), the heating steam 56 is injected through the steam injection nozzle 625 (665) to the upper surface peripheral edge part S8 along an injection path in an obliquely downward direction from an inside of the substrate W6 toward an outside thereof. Consequently, the mist obtained by the condensation of the steam 56 can be prevented from adhering onto the non-processed region of the upper surface S6 due to return to the substrate W6 side.

The on-off valve 675 is on-off controlled by a valve control mechanism 652 which is controlled by means of the control portion 651. The valve control mechanism 652 opens the on-off valve 675 as necessary so that the heating steam 56 supplied from the steam supply source 631 to the heating portion 621 (661) is injected from the steam injection nozzle 625 (665) of the heating portion 621 (661) to the upper surface peripheral edge part S8. Then, the upper surface peripheral edge part S8 is heated.

As described above, the substrate processing device 600 according to the second preferred embodiment includes the two heating portions 621 and 661 which are disposed to be opposed to the two different positions from each other in the rotating track of the peripheral edge part of the substrate W6 respectively, and injects the heating steam from these heating portions to the upper surface peripheral edge part S8 of the substrate W6, thereby heating the upper surface peripheral edge part S8. The substrate processing device 600 may include at least three heating portions which are the same as these heating portions, thereby heating the upper surface peripheral edge part S8. In other words, the substrate processing device 600 includes a plurality of heating portions which is disposed to be opposed to a plurality of different positions in the rotating track of the peripheral edge part of the substrate W6 respectively and serves to heat the peripheral edge part of the substrate W6 in the plurality of positions respectively.

For the heating steam, that is, a heating fluid, it is also possible to employ a fluid other than steam which is made of a material having no chemical reactivity to a substance that is present in the peripheral edge part of the substrate. Moreover, the heating portion of the substrate processing device 600 may irradiate the upper surface peripheral edge part S8 with a laser beam or light emitted from a lamp such as a halogen lamp, thereby heating the upper surface peripheral edge part S8. In other words, it is also possible to implement the plurality of heating portions of the substrate processing device 600 by including at least one of a thermal fluid supplying portion for supplying the heated fluid to the peripheral edge part of the substrate W6 to heat the peripheral edge part and a light irradiating portion for irradiating the peripheral edge part of the substrate W6 with light to heat the peripheral edge part.

Figure 16:
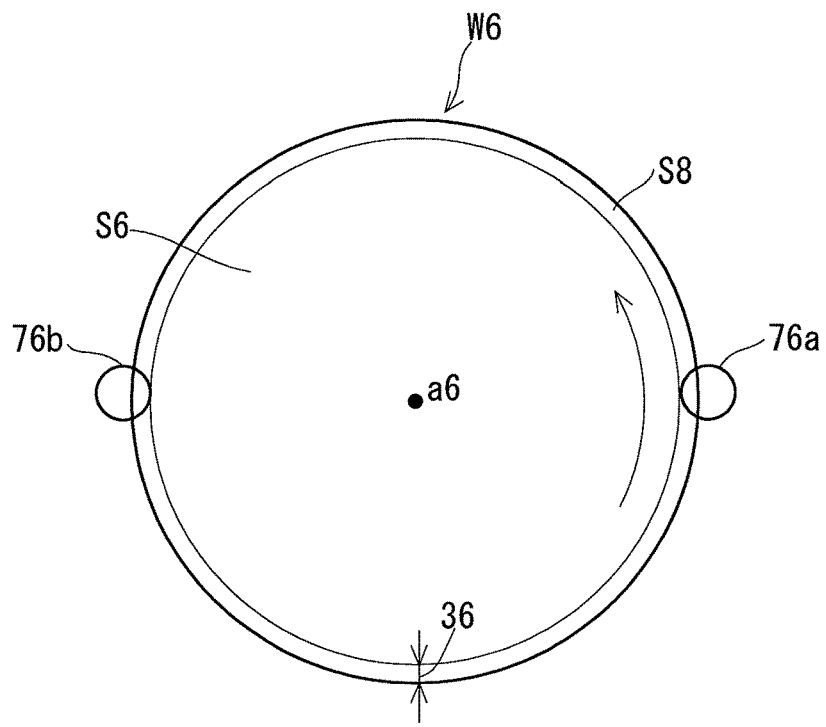
FIG. 16 is a view showing an example of a positional relationship between an injection target region of steam and a peripheral edge part of the substrate.

FIG. 16 is a view showing an example of a positional relationship between injection target regions 76a and 76b of the steam to be injected from the heating portions 621 and 661 respectively and the upper surface peripheral edge part S8 of the substrate W6. As shown in FIG. 16, the heating steam to be injected from each of the heating portions 621 and 661 is injected to be partially applied to the upper surface peripheral edge part S8, so that the upper surface peripheral edge part S8 is spatially exposed to a part of the heating steam. A width 36 is equivalent to a width in a radial direction of the substrate W6 in which the upper surface peripheral edge part S8 is exposed to the heating steam. Similarly, also in the case where heating light is emitted from the heating portion in place of the heated fluid, the upper surface peripheral edge part S8 of the substrate W6 is spatially exposed to a part of the heating light.

In other words, the heating portions 621 and 661 of the substrate processing device 600 are implemented to include at least one of a thermal fluid supplying portion for injecting a thermal medium such as the heating steam to partially expose the peripheral edge part of the substrate W6 to a part of a section of a flux of the thermal medium, thereby heating the peripheral edge part and a light irradiating portion for emitting light to partially expose the peripheral edge parts of the substrate W6 to a part of a section of a bundle of rays for the light, thereby heating the peripheral edge parts respectively.

Figure 17:
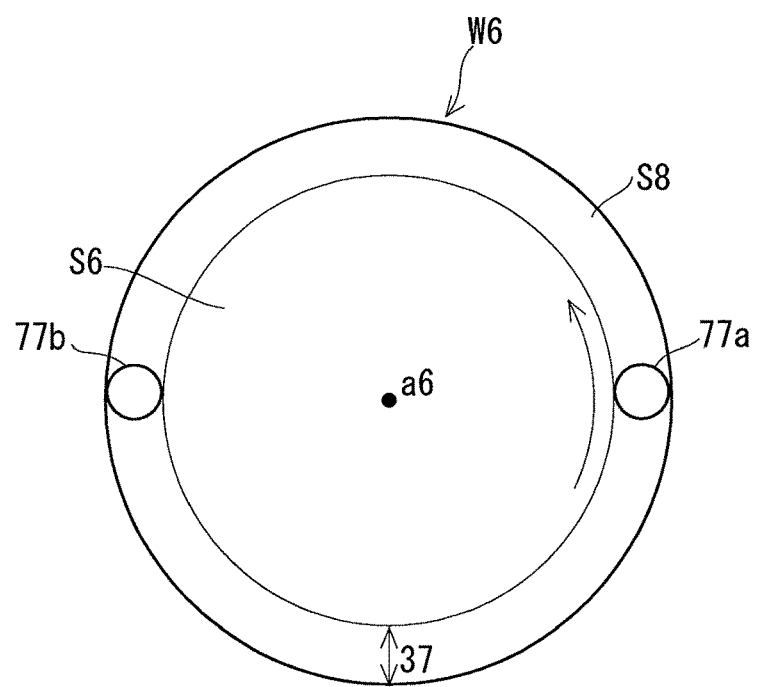
FIG. 17 is a view showing a comparison technique.

For example, as in the injection target regions 77a and 77b shown in FIG. 17, in the case where the upper surface peripheral edge part S8 is exposed to the entire injected heating fluid or the like, a width 37 in a radial direction of the substrate in which the upper surface peripheral edge part S8 is exposed to the heating fluid or the like is greater than a width in the case where the upper surface peripheral edge part S8 is exposed to a part of the heating fluid or the like, for example, the width 36 shown in FIG. 16, and the etching width is thus increased.

In contrast, according to the substrate processing device 600, the upper surface peripheral edge part S8 of the substrate W6 is spatially exposed to a part of the heated fluid to be injected from the plurality of heating portions respectively (light to be irradiated). Consequently, it is possible to reduce the heating width of the upper surface peripheral edge part S8 more greatly while efficiently heating the upper surface peripheral edge part S8. In the case where an etchant (a processing liquid) having a reaction rate increased with a rise in temperature is used, it is possible to reduce an etching width (a chemical treating width) by decreasing the heating width of the upper surface peripheral edge part S8. In the case where the heating steam is injected to the upper surface peripheral edge part S8, it is possible to decrease the etching width to approximately 0.5 mm to 1 mm, for example.

As compared with light emitted from a halogen lamp, the heating steam has a larger amount of heat. Therefore, in the case where the heating steam is injected from the heating portions 621 and 661, it is possible to heat the upper surface peripheral edge part S8 more efficiently as compared with the case where the upper surface peripheral edge part S8 is heated with light emitted from the halogen lamp or the like. Moreover, differently from the case where light is used, glass is not required in the heating portion. For this reason, continuous use for a long period of time is possible even in the case where an HF solution is utilized as a processing liquid, for example.

Moreover, as shown in FIG. 11, the substrate processing device 600 is also provided with a processing liquid supply source 632 for supplying an etchant (a processing liquid) which is stored therein and a rinsing liquid supply source 633 for supplying a rinsing liquid which is stored therein. For example, SC1 (ammonia-hydrogen peroxide mixture), SC2, HF (hydrofluoric acid), or the like is employed for the etchant. If a metal component such as Mo or Co adheres onto a contact part with a wafer in another manufacturing apparatus or a delivery system, an inside of FOUP/FOSB holding a wafer, or the like, contamination is caused. For this reason, the SC2 is used for washing a bevel portion or a back surface of the wafer in order to remove the adhered metal component, for example. Thus, in some cases, the processing liquid stored in the processing liquid supply source 632 is supplied to the wafer for the purpose other than etching.

Pure water (DIW: deionized water) or the like is employed for the rinsing liquid to be supplied by the rinsing liquid supply source 633. Functional water or warm water may be employed for the rinsing liquid.

The pipe 682 connected to the processing liquid supply nozzle 626 of the processing liquid discharging portion 622 is connected in communication with a pipe 883 provided out of the processing liquid supply source 632, and an on-off valve 673 is provided in the middle part of the pipe 883. The pipe 683 connected to the rinsing liquid supply nozzle 627 of the processing liquid discharging portion 622 is connected in communication with a pipe 884 provided out of the rinsing liquid supply source 633. An on-off valve 674 is provided in the middle part of the pipe 884.

The on-off valves 673 and 674 are on-off controlled by means of a valve control mechanism 652 which is controlled by the control portion 651, and the valve control mechanism 652 selectively opens the on-off valve 673 and the on-off valve 674 as necessary.

If the on-off valve 673 is opened, a processing liquid 57 (FIG. 13) supplied from the processing liquid supply source 632 is discharged from the processing liquid supply nozzle 626 of the processing liquid discharging portion 622 and is then supplied to the upper surface peripheral edge part S8. In other words, the processing liquid discharging portion 622 supplies the processing liquid 57 from above to the peripheral edge part of the substrate W6 which is heated by the plurality of heating portions, thereby carrying out a chemical treatment (etching) for the peripheral edge part. A flow rate of the processing liquid to be supplied to the upper surface peripheral edge part S8 is set to be small, for example, approximately 10 ml to 100 ml per minute.

Moreover, if the on-off valve 674 is opened, a rinsing liquid 58 (FIG. 14) supplied from the rinsing liquid supply source 633 is discharged from the rinsing liquid supply nozzle 627 of the processing liquid discharging portion 622 and is then supplied to the upper surface peripheral edge part S8. Consequently, rinsing for the peripheral edge part of the substrate W6 is carried out.

Figure 18:
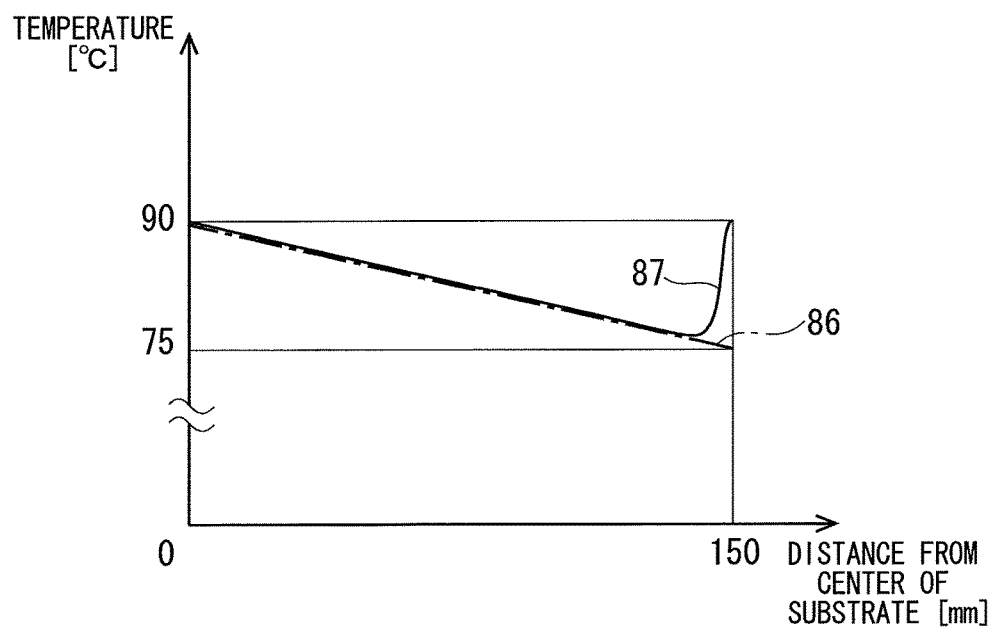
FIG. 18 is a view illustrating, in a graph, a difference in temperature distribution over the substrate depending on presence or absence of a heating portion.

FIG. 18 is a view illustrating, in a graph, a difference in temperature distribution on the substrate W6 depending on presence or absence of the heating portion 621 (661) for heating the upper surface peripheral edge part S8 of the substrate W6. A graph 86 shows an example of a temperature distribution on the upper surface S6 of the substrate W6 in the case where the processing liquid is discharged from a disk-shaped nozzle (not shown) provided on the back surface S7 side of the substrate W6 toward the back surface S7 of the substrate W6 which is being rotated at a predetermined rotating speed for comparison. The processing liquid to be discharged to the back surface S7 has a temperature regulated previously to 90° C. or the like, for example, and is supplied to the peripheral edge part of the substrate W6 by the action of centrifugal force. A graph 87 shows an example of a temperature distribution on the upper surface S6 of the substrate W6 in the case where the processing liquid is supplied to the back surface S7 in the same manner as in the graph 86, and furthermore, the upper surface peripheral edge part S8 is heated by the heating portion 621 (661).

As shown in each of the graphs in FIG. 18, the temperature of the processing liquid is gradually reduced depending on the rotation of the substrate W6 apart from the central part of the substrate W6 so that the temperature on the upper surface S6 is also reduced. However, in the case where the upper surface peripheral edge part S8 is also heated by the heating portion 621 (661), it is possible to raise the temperature of the upper surface peripheral edge part S8 portion as shown in the graph 87. The steam is injected in such a manner that the peripheral edge of the upper surface peripheral edge part S8 is spatially exposed to a part of the steam. Therefore, as shown in the graph 87, it is possible to raise the temperature of a region having a small width of 1 mm or less as compared with the other regions of the upper surface S6 of the substrate W6 from the peripheral edge of the upper surface peripheral edge part S8, for example.

Figure 19:
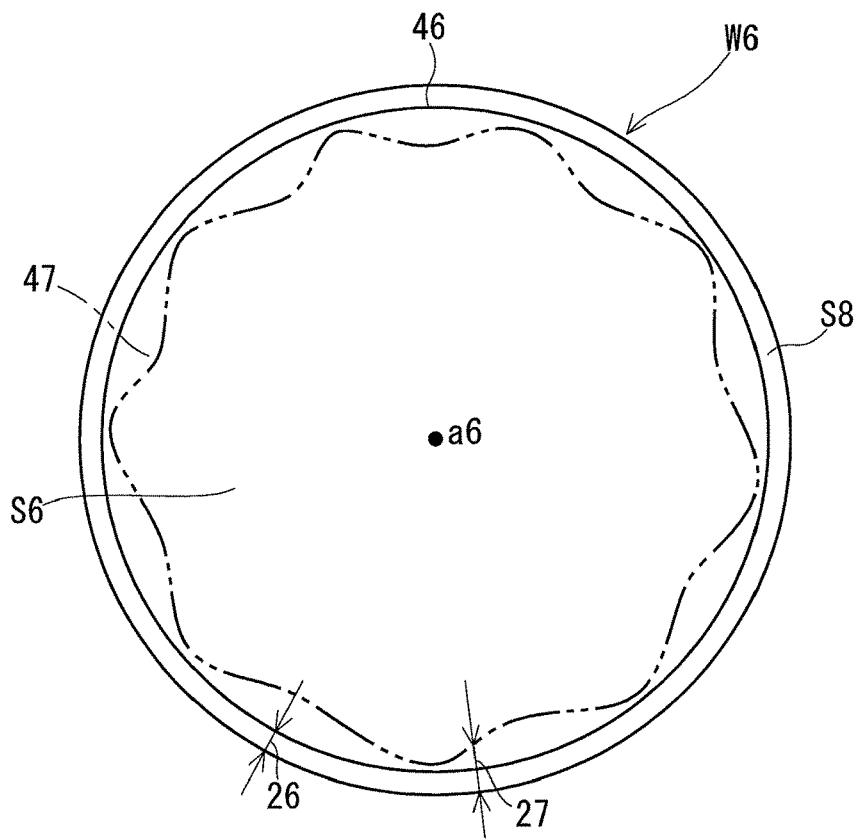
FIG. 19 is a view showing an example of a difference in an etching width over the substrate depending on the presence or absence of the heating portion.

FIG. 19 is a view showing a difference in an etching width over the upper surface S6 of the substrate W6 illustrated in FIG. 20 depending on presence or absence of operations of the heating portion 621 (661) for heating the upper surface peripheral edge part S8 of the substrate W6 and the processing liquid discharging portion 622 for supplying the processing liquid to the upper surface peripheral edge part S8. For convenience of illustration, each etching width is described to be larger than an actual range.

Figure 21:
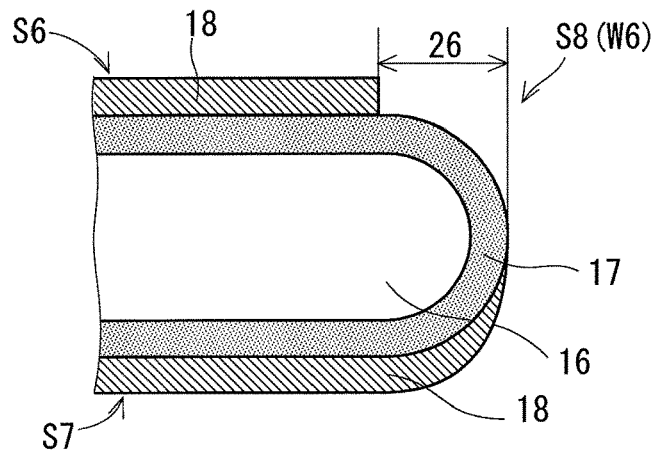
FIG. 21 is a view showing an example of the sectional view obtained after etching for the substrate of FIG. 20.

A substantially circular boundary 46 indicates an example of a boundary between an etched region and a non-processed region which is not subjected to the etching at the rotating axis a6 side in the case where the upper surface peripheral edge part S8 is heated by the heating portion 621 (661), and at the same time, the processing liquid is supplied from the processing liquid supply nozzle 626 to the upper surface peripheral edge part S8. Moreover, FIG. 21 is a view showing an example of a sectional view of the substrate W6 obtained after the etching in this case. The processing liquid is not supplied to the back surface S7 of the substrate W6. A width 26 (FIGS. 19 and 21) indicates an etching width at one point on the boundary 46. The etching width 26 is approximately 0.5 to 1.0 mm, for example, and a variation thereof is reduced to be approximately $\frac{1}{10}$ or less of a mean value of the etching width 26, for example.

Figure 22:
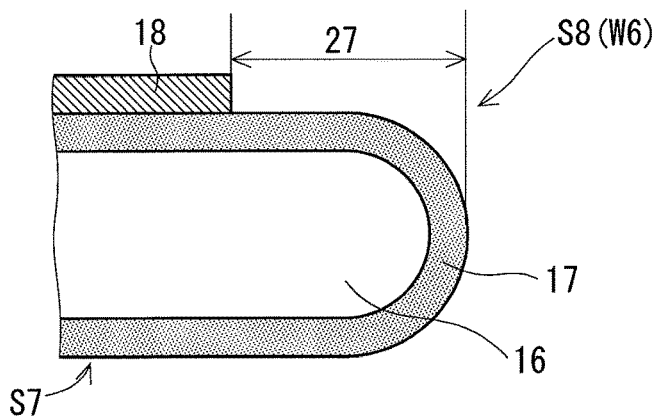
FIG. 22 is a view showing a comparative technique.

A boundary 47 indicates an example of a boundary between an etched region in the upper surface S6 of the substrate W6 and a non-processed region in the case where the etching for the upper surface peripheral edge part S8 is carried out with the processing liquid discharged from the disk-shaped nozzle (not shown) provided on the back surface S7 side of the substrate W6 to the back surface S7 of the substrate W6 which is being rotated for comparison. FIG. 22 is a view showing an example of the sectional view of the substrate W6 obtained after the etching in this case. The centrifugal force acts on the processing liquid discharged to the back surface S7 so that the processing liquid spreads toward the peripheral edge part of the substrate W6, and furthermore, goes around the upper surface peripheral edge part S8. Thus, the upper surface peripheral edge part S8 is etched. There are carried out neither the heating for the upper surface peripheral edge part S8 through the heating portion 621 (661) nor the supply of the processing liquid to the upper surface peripheral edge part S8 through the processing liquid discharging portion 622.

A width 27 indicates an etching width at one point on the boundary 47. It is difficult to control an amount of the processing liquid going around the upper surface peripheral edge part S8 by the action of the centrifugal force. For this reason, a shape of the boundary 47 is more wavy than the boundary 46 taking the substantially circular shape, and the etching width 27 is approximately 2 to 3 mm, for example, and is larger than the etching width 26. Moreover, a variation in the etching width 27 is greater than that in the etching width 26.

As shown in FIGS. 19, 21 and 22, in the case where there are carried out the heating through the heating portion 621 (661) and the supply of the processing liquid through the processing liquid discharging portion 622, the etching width in the upper surface peripheral edge part S8 is smaller and the variation in the etching width is also reduced more greatly as compared with the case where the etching is carried out by the wraparound of the processing liquid from the back surface S7 side.

As described above, in the substrate processing device 600, the peripheral edge parts are heated in the plurality of different positions in the rotating track of the peripheral edge parts of the substrate W6 respectively so that the processing liquid is supplied to the peripheral edge parts from above. Therefore, even in the case where the heating width in the radial direction of the substrate W6 in the peripheral edge part is small, the temperature of the peripheral edge part is prevented from being reduced. For this reason, even if the amount of the processing liquid to be supplied to the peripheral edge part is small, it is possible to suppress reduction in the reaction rate of the processing liquid in the region having a small width which is heated by the heating portion in the peripheral edge part of the upper surface of the substrate W6, thereby increasing the reactivity of the processing liquid. Accordingly, it is possible to decrease the chemical treating width while suppressing deterioration in each of the uniformity of the chemical treating width and the processing efficiency.

As shown in FIG. 12, the steam 56 (FIG. 13) is injected from the heating portion 621 to the upper surface peripheral edge part S8 in a predetermined position (a first position) of the rotating track of the upper surface peripheral edge part S8 of the substrate W6. Then, the processing liquid 57 is supplied from the processing liquid discharging portion 622 to the upper surface peripheral edge part S8 in a predetermined position (a second position) placed behind the predetermined position along the rotating track. Accordingly, the processing liquid 57 is supplied from the processing liquid discharging portion 622 to the upper surface peripheral edge part S8 portion heated by the heating portion 621 immediately after the heating. Thereafter, the etching for the portion is carried out. Thus, the reduction in the temperature of the upper surface peripheral edge part S8 heated by the heating portion 621 is suppressed, and at the same time, the etching for the upper surface peripheral edge part S8 is carried out. Therefore, the etching rate can be enhanced.

If the plurality of heating portions 621 and 661 are close to each other in the vicinity of the first position, it is possible to further efficiently raise the temperature of the portion to which the processing liquid is supplied from the processing liquid discharging portion 622 in the second position as compared with the case where the plurality of heating portions are provided apart from each other as shown in FIG. 12. Accordingly, even if the plurality of heating portions 621 and 661 are close to each other in the vicinity of the first position, the usefulness of the present invention is not lost.

Moreover, as shown in FIG. 11, a nitrogen gas supply source 634 is provided on the outside of the substrate processing device 600. As shown in FIGS. 13 to 15, the nitrogen gas is supplied from the nitrogen gas supply source 634 through a pipe 881 to the pipe 684 (694) connected to the nitrogen gas injecting portion 624 (664) ("the gas injecting portion") of the substrate processing device 600. An on-off valve 671 to be on-off controlled by the valve control mechanism 652 is provided in the middle part of the pipe 881 in the substrate processing device 600. The pipe 881 branches into two parts at the downstream side of the on-off valve 675 (the spin chuck 611 side). One of the branching pipes 881 is connected in communication with the pipe 684 and the other is connected in communication with the pipe 694.

When the control portion 651 opens the on-off valve 671 through the valve control mechanism 652, the nitrogen gas is supplied from the nitrogen gas supply source 634 to the nitrogen gas injecting portion 624 (664). The nitrogen gas injecting portion 624 (664) is configured to have a slender arcuate sectional shape in a circumferential direction of the substrate W6, for example. The nitrogen gas injection nozzle 628 (668) is configured by an injection nozzle having a slender arc-shaped opening in the circumferential direction of the substrate W6 on a lower surface of the nitrogen gas injecting portion 624 (664), a plurality of cylindrical injection nozzles provided at a predetermined interval on the lower surface of the nitrogen gas injecting portion 624 (664) or the like. The nitrogen gas supplied to the nitrogen gas injecting portion 624 (664) is injected as a nitrogen gas G6 (a gas for purge) from the nitrogen gas injection nozzle 628 (668) to the upper surface S6 of the rotating substrate W6.

In more detail, a nitrogen gas G6 is injected from the nitrogen gas injection nozzle 628 (668) provided above the substrate W6 toward a predetermined injection target region defined within a range surrounded by the rotating track of the upper surface peripheral edge part S8 in the upper surface S6 of the substrate W6. Then, the nitrogen gas G6 injected onto the upper surface S6 forms a gas flow which flows from the injection target region toward the upper surface peripheral edge part S8 of the substrate W6. Mist obtained by the condensation of the steam 56 injected from the heating portion 621 (661) to the upper surface peripheral edge part S8 through the air flow formed by the nitrogen gas G6, the processing liquid 57 discharged from the processing liquid supply nozzle 626 of the processing liquid discharging portion 622, or the like can be prevented from adhering onto the non-processed region in the upper surface S6 of the substrate W6 in which the etching is not carried out. Therefore, it is possible to supply a sufficient amount of steam for heating the peripheral edge part of the substrate W6 while suppressing deterioration in the non-processed region due to the adhering of the mist.

Moreover, also in a drying treatment for the upper surface S6 of the substrate W6 after the end of the rinsing, the substrate W6 is promoted to be dried with the nitrogen gas G6 supplied from the nitrogen gas injection nozzle 628 (668), and furthermore, the rinsing liquid shaken off from the upper surface peripheral edge part S8 toward the outside of the substrate W6 by the centrifugal force acting through the high-speed rotation of the substrate W6 can be prevented from returning to the substrate W6 and adhering onto the non-processed region of the upper surface S6. Even if the substrate processing device 600 includes neither the nitrogen gas supply source 634 nor the nitrogen gas injecting portions 624 and 664, it is possible to reduce the etching width while suppressing deterioration in each of the uniformity of the etching width and the etching rate. Therefore, the usefulness of the present invention is not lost.

4. Operation of Substrate Processing Device

Figure 23:
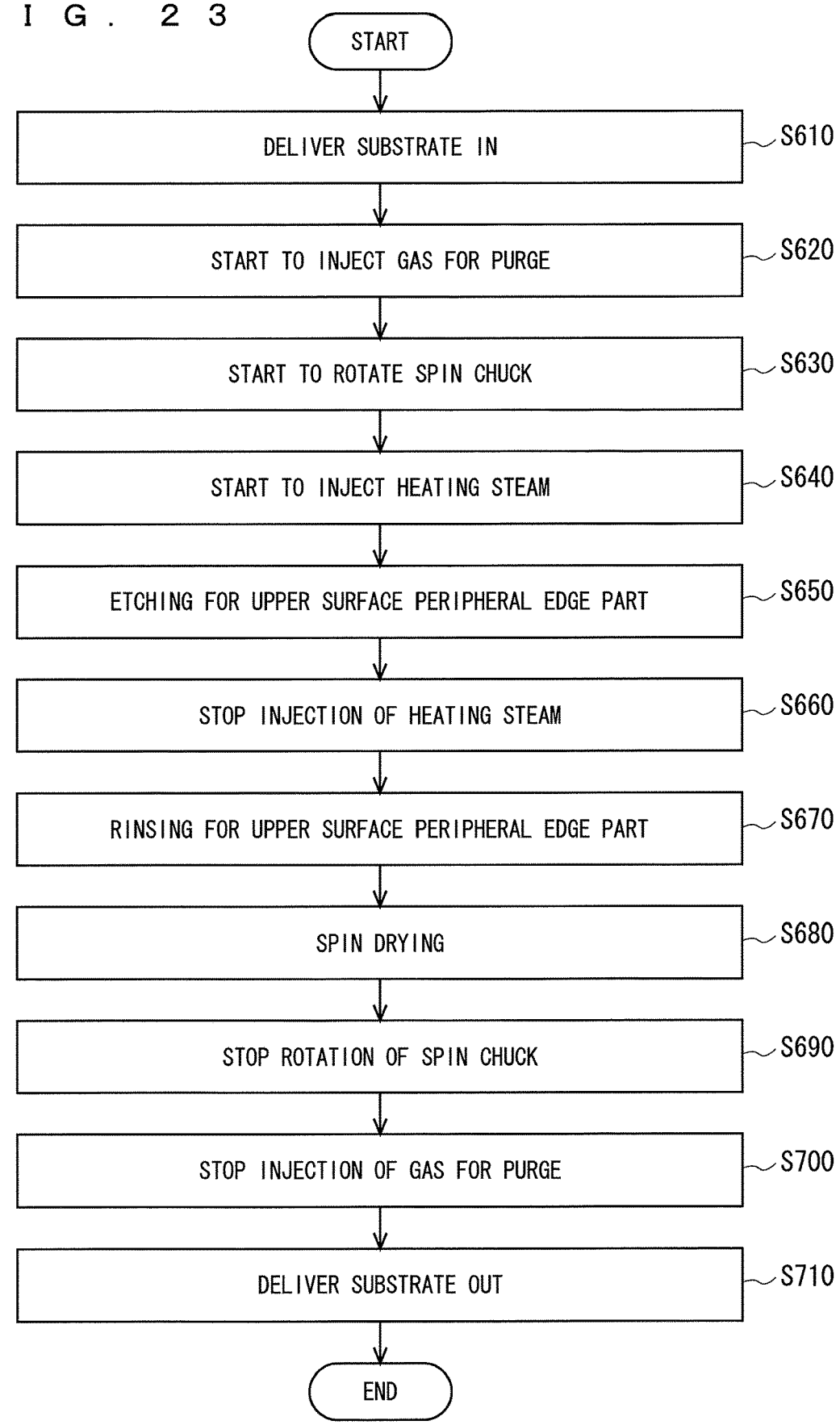
FIG. 23 is a flow chart illustrating an example of a flow of substrate processing according to the second preferred embodiment.

FIG. 23 is a flow chart showing an example of a flow of substrate processing to be carried out by the substrate processing device 600 according to the second preferred embodiment. Before the start of the processing, each of the on-off valves is closed and the spin chuck 611 is stationary. Moreover, the nozzle units 620 and 660 are placed in standby positions other than the delivery-in path for the substrate W6. First of all, the single substrate W6 is delivered by a substrate delivery robot (not shown) into a processing chamber (chamber) (not shown) in which the spin chuck 611 is disposed, and is mounted on the spin chuck 611 to be held by the chuck pin 617 (step S610).

Subsequently, the nozzle units 620 and 660 are placed in predetermined positions above the upper surface peripheral edge part S8 of the substrate W6. Then, the on-off valve 671 is opened and the nitrogen gas injecting portions 624 and 664 inject, as the nitrogen gas G6 (the gas for purge), the nitrogen gas supplied from the nitrogen gas supply source 634 toward the upper surface peripheral edge part S8 of the substrate W6 (step S620).

Next, the control portion 651 controls the chuck rotating mechanism 654 so that the rotation of the spin chuck 611 is started in such a manner that the rotating speed of the spin chuck 611 becomes a predetermined high rotating speed of 50 rpm to 800 rpm, for example (step S630). Then, the on-off valve 675 is opened and the heating steam generated by the steam supply source 631 and heated by the heater 639 is supplied to the nozzle units 620 and 660. The nozzle units 620 and 660 start to inject the heating steam from the steam injection nozzles 625 and 665 toward the region having a small width at the peripheral edge side of the upper surface peripheral edge part S8 (step S640), thereby starting to heat the upper surface peripheral edge part S8. The heating steam is injected from the steam injection nozzles 625 and 665 in such a manner that the upper surface peripheral edge part S8 is spatially exposed to a part of the heating steam.

Subsequently, the etching for the upper surface peripheral edge part S8 of the substrate W6 is carried out (step S650). More specifically, the on-off valve 673 is opened so that the processing liquid is supplied from the processing liquid supply source 632 to the processing liquid discharging portion 622 of the nozzle unit 620 and discharged from the processing liquid supply nozzle 626 to a narrow width region at the peripheral edge side of the upper surface peripheral edge part S8 which is heated. Then, the etching for the upper surface peripheral edge part S8 of the substrate W6 is carried out with the discharged processing liquid.

When a predetermined time elapsed and the etching for the upper surface peripheral edge part S8 is completed, the on-off valve 673 is closed so that the supply of the processing liquid to the substrate W6 is stopped. Thereafter, the on-off valve 675 is closed so that the injection of the heating steam is stopped (step S660).

Subsequently, the rinsing for the upper surface peripheral edge part S8 of the substrate W6 is carried out (step S670). More specifically, the on-off valve 674 is opened and the rinsing liquid is started to be supplied from the rinsing liquid supply source 633. Then, the rinsing liquid is discharged from the rinsing liquid supply nozzle 627 of the processing liquid discharging portion 622 to the upper surface peripheral edge part S8 so that the rinsing for the upper surface peripheral edge part S8 is carried out. When a predetermined time elapsed and the rinsing for the upper surface peripheral edge part S8 is completed, the on-off valve 674 is closed so that the supply of the rinsing liquid is stopped.

Next, the rotation of the spin chuck 611 is continuously carried out for a predetermined time in a state in which the rotating speed of the spin chuck 611 is set to be a high rotating speed of 1000 rpm to 1500 rpm. Consequently, the rinsing liquid remaining in the upper surface peripheral edge part S8 is shaken off toward the outside of the substrate W6 by the action of centrifugal force so that a drying treatment (spin drying) for the upper surface S6 of the substrate W6 is carried out (step S680). In the spin drying, the nitrogen gas G6 is continuously supplied from the nitrogen gas injection nozzles 628 and 668 of the nitrogen gas injecting portions 624 and 664 to the upper surface peripheral edge part S8. Consequently, drying of the rinsing liquid adhering onto the upper surface peripheral edge part S8 is promoted, and furthermore, the shaken-off rinsing liquid can be prevented from returning to the substrate W6 side and adhering onto the non-processed region of the upper surface S6.

When a predetermined time elapsed since the start of the drying treatment, the rotation of the spin chuck 611 is stopped so that the drying treatment is ended (step S690). Subsequently, the on-off valve 671 is closed so that the injection of the nitrogen gas G6 (the gas for purge) from the nitrogen gas injecting portions 624 and 664 is stopped (step S700).

When the injection of the gas from the nitrogen gas injecting portions 624 and 664 is stopped, the control portion 651 controls the nozzle rotating mechanisms 655 and 656 to move the nozzle units 620 and 660 to the standby positions. Then, the processed substrate W6 is removed from the spin chuck 611 and is thus delivered to the outside of the processing chamber by means of a delivery robot (not shown) (step S710) so that the substrate processing to be carried out by the substrate processing device 600 is ended.

According to the substrate processing device in accordance with the second preferred embodiment configured as described above, the peripheral edge parts are heated in the plurality of different positions in the rotating track of the peripheral edge parts of the substrate W6 respectively so that the processing liquid is supplied to the peripheral edge parts from above. Consequently, even in the case where the heating width in the radial direction in the peripheral edge part is small, the temperature of the peripheral edge part is prevented from being reduced. Even if the amount of the processing liquid to be supplied to the peripheral edge part is small, it is possible to suppress reduction in the reaction rate of the processing liquid in the region having a small width at the peripheral edge side which is heated by the heating portion in the peripheral edge part of the upper surface S6 of the substrate W6, thereby increasing the reactivity of the processing liquid. Accordingly, it is possible to decrease the chemical treating width while suppressing deterioration in each of the uniformity of the chemical treating width (the etching width) and the processing efficiency.

Moreover, according to the substrate processing device in accordance with the second preferred embodiment configured as described above, it is also possible to implement the plurality of heating portions by including at least one of the thermal fluid supplying portion for supplying, to the peripheral edge part of the substrate W6, the heated fluid which is made of the material having no chemical reactivity to the substance which is present in the peripheral edge part, thereby heating the peripheral edge part, and the light irradiating portion for irradiating the peripheral edge part of the substrate W6 with light to heat the peripheral edge part. The peripheral edge part of the substrate W6 is spatially exposed to a part of the heated fluid and the light. Accordingly, it is possible to reduce the heating width of the upper surface peripheral edge part S8 more greatly while heating the upper surface peripheral edge part S8 efficiently. Therefore, in the case where the etchant (the processing liquid)

having a reaction rate increased with a rise in temperature is used, it is possible to decrease the etching width (the chemical treating width) by reducing the heating width of the upper surface peripheral edge part S8.

Furthermore, according to the substrate processing device in accordance with the second preferred embodiment configured as described above, the heating steam is injected as the heating fluid from each of the plurality of heating portions to the peripheral edge part of the substrate W6 to heat the peripheral edge part. Accordingly, as compared with the case where the upper surface peripheral edge part S8 is heated with light emitted from a halogen lamp or the like, it is possible to heat the upper surface peripheral edge part S8 more efficiently. Moreover, differently from the case where light is used, glass is not required in the heating portion. For this reason, continuous use for a long period of time is possible even in the case where a processing liquid having reactivity to the glass is used.

Furthermore, according to the substrate processing device in accordance with the second preferred embodiment configured as described above, the superheated steam having the high temperature is used as the heating steam. For this reason, the steam can be maintained at a high temperature even after being injected from the steam injection nozzle and used for heating the upper surface peripheral edge part S8. Consequently, it is possible to prevent the steam from being changed into mist in the peripheral edge part. Therefore, the mist obtained by the condensation of the steam can be prevented from adhering onto the non-processed region of the substrate W6. Moreover, if the superheated steam having a high temperature is thus used, it is possible to raise the temperature of the upper surface peripheral edge part S8 of the substrate W6 more greatly as compared with the case where saturated steam having a temperature of 100° C. or less is used in the heat treatment, for example. Consequently, it is possible to increase the etching rate more greatly.

Moreover, according to the substrate processing device in accordance with the second preferred embodiment configured as described above, the heating steam is injected through each of the steam injection nozzles to the peripheral edge part along the injection path in the obliquely downward direction from the inside of the substrate W6 toward the outside thereof. Consequently, there is generated a gas flow of the steam which flows from the upper surface peripheral edge part S8 of the substrate W6 toward the outside of the substrate W6. Therefore, the mist obtained by the condensation of the steam can be prevented from adhering onto the non-processed region of the upper surface S6 of the substrate W6 due to return to the substrate W6 side.

Furthermore, according to the substrate processing device in accordance with the second preferred embodiment configured as described above, the gas (the nitrogen gas G6) is injected from above the substrate W6 toward the predetermined injection target region defined within the range surrounded by the rotating track of the upper surface peripheral edge part S8 of the substrate W6 in the upper surface S6 of the substrate W6. Consequently, there is generated, on the substrate W6, the gas flow which flows from the injection target region toward the upper surface peripheral edge part S8 of the substrate W6. Therefore, the mist obtained by the condensation of the steam or the mist-like processing liquid can be prevented from adhering onto the non-processed region in the upper surface S6 of the substrate W6. Accordingly, it is possible to supply a sufficient amount of steam for heating the peripheral edge part S8 of the substrate W6 while inhibiting the non-processed region from being deteriorated by the adhering of the mist.

In the substrate processing device 600, for example, a nitrogen gas heating portion may further be provided in the pipe 881 for supplying the nitrogen gas G6 from the nitrogen gas supply source 634 to the nitrogen gas injecting portion 624 (664) in such a manner that the heated nitrogen gas G6 is supplied to the upper surface peripheral edge part S8 of the substrate W6. If the heated nitrogen gas G6 is supplied, the etching rate can further be enhanced. Moreover, the nitrogen gas supply source 634 or the steam supply source 631 may be provided in the substrate processing device 600, for example. It is also possible to employ a structure in which a dry gas such as dry air or an inert gas other than the nitrogen gas is supplied in place of the supply of the nitrogen gas through the nitrogen gas supply source 634. Moreover, although the respective nozzles or the like in the nozzle units 620 and 660 are moved integrally with the substrate W6, they may be configured to be individually movable.

While the invention has been shown and described in detail, the foregoing description is in all aspects illustrative and not restrictive. It is therefore understood that numerous modifications and variations can be devised without departing from the scope of the invention.

What is claimed is:

1. A substrate processing method for carrying out a chemical treatment for a substrate by using a processing liquid having a reaction rate that increases with a rise in temperature, the method comprising:
   a rotating step including holding a substrate having a peripheral edge part in a substantially horizontal posture and rotating the substrate in a substantially horizontal plane around a rotation axis;
   a heating step including heating the peripheral edge part at a plurality of different positions in a rotating track of said peripheral edge part of said substrate during said rotating step; and
   a peripheral edge processing step including supplying a processing liquid from above to said peripheral edge part, to a location on said peripheral edge part which enables said processing liquid to be heated in said heating step, thereby carrying out a chemical treatment of said peripheral edge part,
   wherein said heating step includes supplying a heated fluid to a target region defined partially at said rotating track, said target region corresponding to at least one of said different positions,
   wherein said heated fluid is made of a material having no chemical reactivity to substances present in said peripheral edge part of said substrate, and wherein a portion of said target region overlaps said rotating track, and wherein a remaining portion of said target region protrudes from said substrate.

2. The substrate processing method according to claim 1, wherein
   said peripheral edge part of said substrate is spatially exposed to a part of said heated fluid.

3. The substrate processing method according to claim 2, wherein said heating step injects water vapor as said heated fluid.

4. The substrate processing method according to claim 3, wherein said water vapor is superheated water vapor.

5. The substrate processing method according to claim 3, wherein said heating step injects said water vapor to said peripheral edge part along an injection path in an obliquely downward direction having a direction of flow away said rotation axis.

6. The substrate processing method according to claim 3, further comprising a gas injecting step of injecting a gas from above said substrate toward a predetermined injection target region defined within a range surrounded by said rotating track of said peripheral edge part of said substrate in an upper surface of said substrate, to generate, on the substrate, a gas flow which flows from said injection target region away from said rotation axis.

7. The substrate processing method according to claim 1, wherein said heating step supplies a heating water vapor as said heated fluid to heat said peripheral edge part.

8. A substrate processing method for carrying out a chemical treatment for a substrate by using a processing liquid having a reaction rate that increases with a rise in temperature, the method comprising:
- a rotating step including holding a substrate in a substantially horizontal posture and rotating the substrate in a substantially horizontal plane around a rotation axis;
- a heating step including using a plurality of heating portions that eject heated water vapor to heat a peripheral edge part of the substrate at a plurality of different positions in a rotating track of said peripheral edge part of said substrate during said rotating step; and
- a peripheral edge processing step including supplying a processing liquid from above to said peripheral edge part and heating the processing liquid with said heating portions during said heating step, thereby carrying out a chemical treatment of said peripheral edge part, and further comprising
- a providing step including providing a plurality of gas injecting portions respectively corresponding to the plurality of heating portions;
- a holding step including integrally holding a first of said heating portions that ejects a first heating water vapor and a first of said gas injecting portions by a first arm that allows position-adjusting, and integrally holding a second of said heating portions that eject a second heating water vapor and a second of gas injecting portions by a second arm that allows position-adjusting, said first and second gas injecting portions respectively corresponding to said first and second heating water vapors, said second heating water vapor being different from said first heating water vapor, said second gas injecting portion being different from said first gas injecting portion, and said second arm being different from said first arm;
- an opposing injection step including injecting from said first and second gas injection portions a gas directed from above at said substrate and at opposing locations on said peripheral edge part of said substrate in an upper surface of said substrate; and
- a gas flow generation step including applying said gas to said opposing locations toward said peripheral edge part of said substrate, wherein said opposing locations are radially closer to said rotation axis that said heating portions.

9. The substrate processing method according to claim 8, wherein each of said plurality of gas injecting portions injects said gas along an injection path in an obliquely downward direction having a direction of flow away from said rotation axis.

* * * * *